US012701879B2

(12) United States Patent
Saitoh et al.

(10) Patent No.: US 12,701,879 B2
(45) Date of Patent: Aug. 4, 2026

(54) DISPLAY DEVICE INCLUDING PROJECTING SHAPED BANK PORTION

(71) Applicant: Sharp Display Technology Corporation, Kameyama City (JP)

(72) Inventors: Takao Saitoh, Kameyama City (JP); Yohsuke Kanzaki, Kameyama City (JP); Masaki Yamanaka, Kameyama City (JP); Masahiko Miwa, Kameyama City (JP); Yi Sun, Kameyama City (JP); Masaki Fujiwara, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 367 days.

(21) Appl. No.: 18/278,404

(22) PCT Filed: Mar. 25, 2021

(86) PCT No.: PCT/JP2021/012582
§ 371 (c)(1),
(2) Date: Aug. 22, 2023

(87) PCT Pub. No.: WO2022/201437
PCT Pub. Date: Sep. 29, 2022

(65) Prior Publication Data
US 2024/0138212 A1 Apr. 25, 2024
US 2024/0237434 A9 Jul. 11, 2024

(51) Int. Cl.
*H10K 59/13* (2023.01)
*H10K 59/12* (2023.01)
(Continued)

(52) U.S. Cl.
CPC ....... *H10K 59/131* (2023.02); *H10K 59/1201* (2023.02); *H10K 59/122* (2023.02);
(Continued)

(58) Field of Classification Search
CPC .... H10K 59/131; H10K 59/122; H10K 59/40; H10K 59/873; H10K 59/12;
(Continued)

(56) References Cited

U.S. PATENT DOCUMENTS 9,665,194 B2 * 5/2017 Ito ...................... G06F 3/04164
11,818,912 B2 * 11/2023 Tsai ...................... H10K 50/11
(Continued)

FOREIGN PATENT DOCUMENTS

CN 111192882 A * 5/2020 ............. H10K 59/40
EP 3657546 A1 * 5/2020 ......... H10K 59/8731
(Continued)

*Primary Examiner* — Ida M Soward
(74) *Attorney, Agent, or Firm* — ScienBiziP, P.C.

(57) ABSTRACT

In an organic EL display device, a frame region provided outside a display region is provided with a damming wall extending on an outer periphery of the display region and a second lead-out wiring line extending across the damming wall from the display region side to an outside of the frame region. The damming wall includes a bank portion having a projecting shape and provided, in a part in which the second lead-out wiring line extends, on both sides in a direction in which the second lead-out wiring line extends with respect to a top portion of the damming wall. The bank portion is lower than a top portion of a second damming wall and forms, between the bank portion and the top portion, a trap portion having a recessed shape.

17 Claims, 20 Drawing Sheets

(51) Int. Cl.

| | |
|---|---|
| *H10K 59/122* | (2023.01) |
| *H10K 59/131* | (2023.01) |
| *H10K 59/40* | (2023.01) |
| *H10K 59/80* | (2023.01) |
| *G09F 9/30* | (2006.01) |
| *H10K 50/844* | (2023.01) |
| *H10K 59/121* | (2023.01) |
| *H10K 59/123* | (2023.01) |
| *H10K 59/124* | (2023.01) |
| *H10K 77/10* | (2023.01) |

(52) U.S. Cl.

CPC ........... *H10K 59/40* (2023.02); *H10K 59/873* (2023.02); *G09F 9/301* (2013.01); *H10K 50/844* (2023.02); *H10K 59/12* (2023.02); *H10K 59/1216* (2023.02); *H10K 59/123* (2023.02); *H10K 59/124* (2023.02); *H10K 77/111* (2023.02)

(58) Field of Classification Search

CPC .............. H10K 59/123; H10K 59/124; H10K 59/1216; H10K 50/844; H10K 77/111; G09F 9/30; G09F 9/301

See application file for complete search history.

(56) References Cited

U.S. PATENT DOCUMENTS

| | | | | |
|---|---|---|---|---|
| 2007/0212526 A1* | 9/2007 | Chou | ..................... | B41M 3/003 |
| | | | | 428/195.1 |
| 2019/0363267 A1* | 11/2019 | Tanaka | ................... | H05B 33/02 |
| 2020/0091459 A1* | 3/2020 | Senoo | ................. | H10K 59/124 |
| 2020/0212126 A1* | 7/2020 | Kim | ..................... | H10K 59/353 |
| 2020/0328376 A1* | 10/2020 | Seo | .................... | H10K 59/8731 |

FOREIGN PATENT DOCUMENTS

| | | | | |
|---|---|---|---|---|
| JP | 2019-117783 A | 7/2019 | | |
| JP | 2019175788 A | 10/2019 | | |
| WO | WO-2018167926 A1 * | 9/2018 | ............. | H05B 33/12 |

* cited by examiner

66

66ei
66et
66le
66ht
66hi

DISPLAY DEVICE INCLUDING PROJECTING SHAPED BANK PORTION

TECHNICAL FIELD

The disclosure relates to a display device.

BACKGROUND ART

In recent years, organic electro luminescence (hereinafter, referred to as EL) display devices using organic EL elements have been used in practical applications. As the structure of the organic EL display device, a structure in which a wall body is provided in a frame region around a display region has been proposed. For example, PTL 1 discloses a display device in which a projecting structure serving as the wall body is provided surrounding a display region. In this display device, the projecting structure suppresses a crack generated in a barrier layer (inorganic barrier layer) sealing an organic EL element from spreading to a display region.

CITATION LIST

Patent Literature

PTL 1: JP 2019-117783 A

SUMMARY

Technical Problem

When the organic EL display device provided with the above-described wall body is an on-cell display device with a touch panel, the touch panel is built on a barrier layer. In this case, a wiring line needs to be lead out from a detection electrode that detects the touch position in the touch panel to the frame region. When formed across the wall body, the lead-out wiring line is likely to be interrupted and disconnect at the top portion of the wall body because, at the time of patterning to create the wiring line, the resist used for the mask flows from the top portion of the wall body and becomes thin at the top portion before exposure.

An object of the technology of the disclosure is to suppress disconnection of a wiring line on a wall body in a frame region of a display device.

Solution to Problem

The technology of the disclosure is for a display device including a substrate layer and a light-emitting element layer including a plurality of light-emitting elements and supported by the substrate layer. A display device according to the technology of the disclosure includes a display region for displaying an image by light emission of the plurality of light-emitting elements, and a frame region provided outside the display region. The frame region is provided with a wall body supported by the substrate layer and extending on an outer periphery of the display region, and a wiring line extending across the wall body from the display region side to an outside of the frame region. The wall body includes a bank portion having a projecting shape and provided, in a part where the wiring line extends, on at least one side in a direction in which the wiring line extends with respect to a top portion of the wall body. The bank portion is lower than the top portion of the wall body, and forms, between the bank portion and the top portion, a trap portion having a recessed shape.

Advantageous Effects of Disclosure

According to the technology of the disclosure, disconnection of the wiring line on the wall body can be suppressed in the frame region of the display device.

BRIEF DESCRIPTION OF DRAWINGS

In FIG. 13, the left figure is a cross-sectional view of a part corresponding to FIG. 11, and the right figure is a cross-sectional view of a part corresponding to FIG. 12.

In FIG. 14, the left figure is a cross-sectional view of a part corresponding to FIG. 11, and the right figure is a cross-sectional view of a part corresponding to FIG. 12.

In FIG. 15, the left figure is a cross-sectional view of a part corresponding to FIG. 11, and the right figure is a cross-sectional view of a part corresponding to FIG. 12.

DESCRIPTION OF EMBODIMENTS

Figure 1:
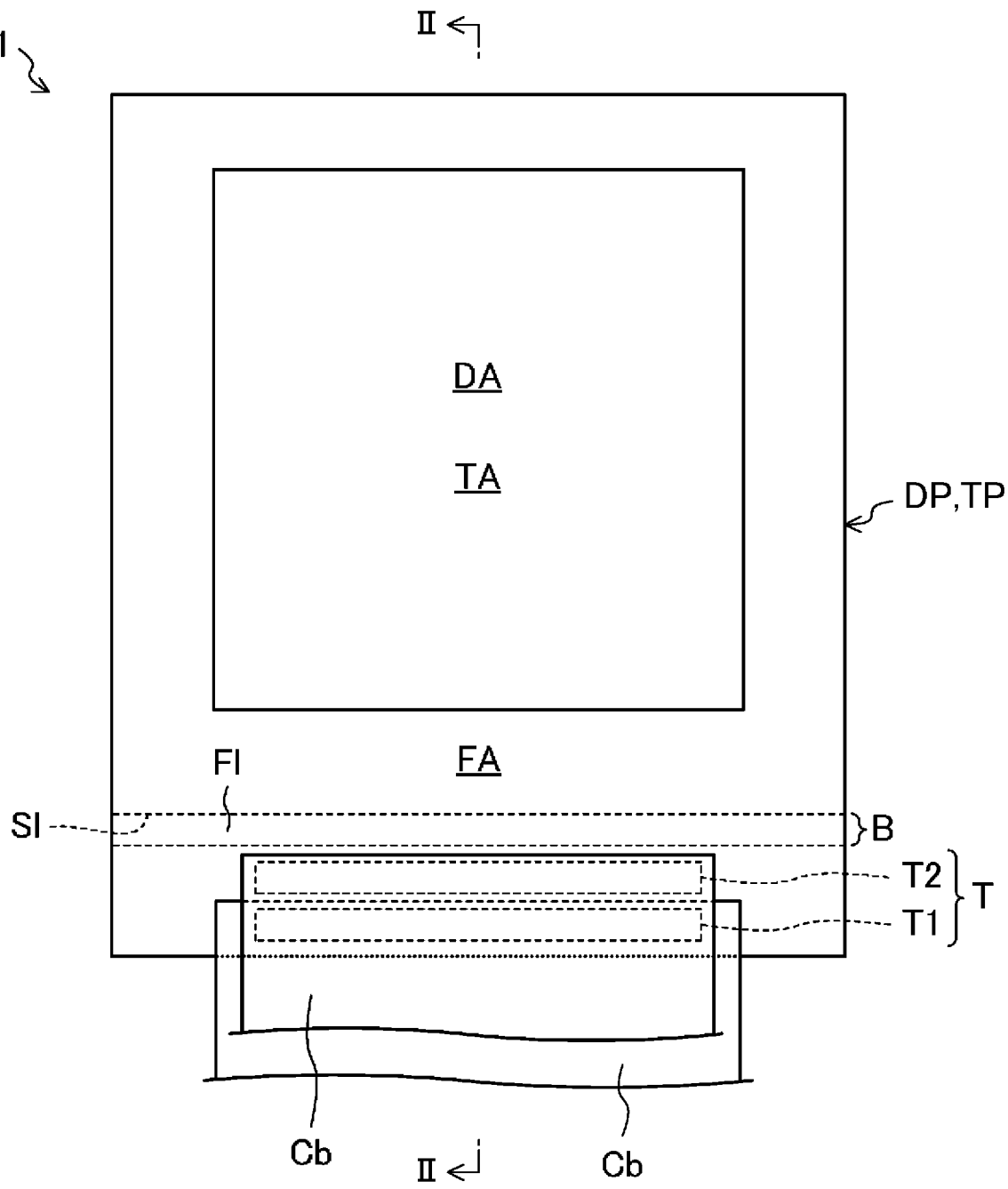
FIG. 1 is a plan view illustrating a schematic configuration of an organic EL display device.

Exemplary embodiments will be described below in detail with reference to the drawings. In the following embodiments, as a display device according to the technology of the disclosure, an organic EL display device including an organic EL element as a light-emitting element will be described as an example.

Note that in the following embodiments, the description that a constituent element such as another film, layer, or element is provided or formed on a constituent element such as a certain film, layer, or element does not mean only a case where another constituent element is present immediately above the certain constituent element but also includes a case where a constituent element such as still another film, layer, or element is interposed between both the constituent elements.

In the following embodiments, the description that a constituent element such as a certain film, layer, or element is connected to a constituent element such as another film, layer, or element means that the certain film, layer, or element is electrically connected unless otherwise specified. This description includes, without departing from the gist of the technique of the disclosure, not only a case in which a constituent element is directly connected to another constituent element but also a case in which a constituent element and another constituent element are indirectly connected to each other with still another constituent element such as still another film, layer, element, or the like interposed therebetween. The description also includes a case where another constituent element is integrated with a certain constituent element, that is, a part of the certain constituent element constitutes the other constituent element.

In the following embodiments, the description that a constituent element such as a certain film, layer, or element is in the same layer as a constituent element such as another film, layer, or element means that the certain constituent element is formed by the same process as that of the other constituent element. The description that a constituent element such as a certain film, layer, or element is in a lower layer than a constituent element such as another film, layer, or element means that the certain constituent element is formed by a process earlier than that of the other constituent element. The description that a constituent element such as a certain film, layer, or element is in an upper layer than a constituent element such as another film, layer, or element means that the certain constituent element is formed by a process later than that of the other constituent element.

In the following embodiments, the description that a constituent element such as a certain film, layer, or element is the same as or equivalent to a constituent element such as another film, layer, or element does not only mean a state where the certain constituent element is completely the same as or completely equivalent to the other constituent element, an also includes a state where the certain constituent element is substantially the same as or substantially equivalent to the other constituent element, such as a state where the certain constituent element and the other constituent element vary within a range of manufacturing modified examples or tolerances.

In the following embodiments, the descriptions of first, second, third, . . . are used to distinguish the words and phrases to which these descriptions are given, and no limitation with regard to the number and order of the words and phrases is intended.

Embodiments

Figure 2:
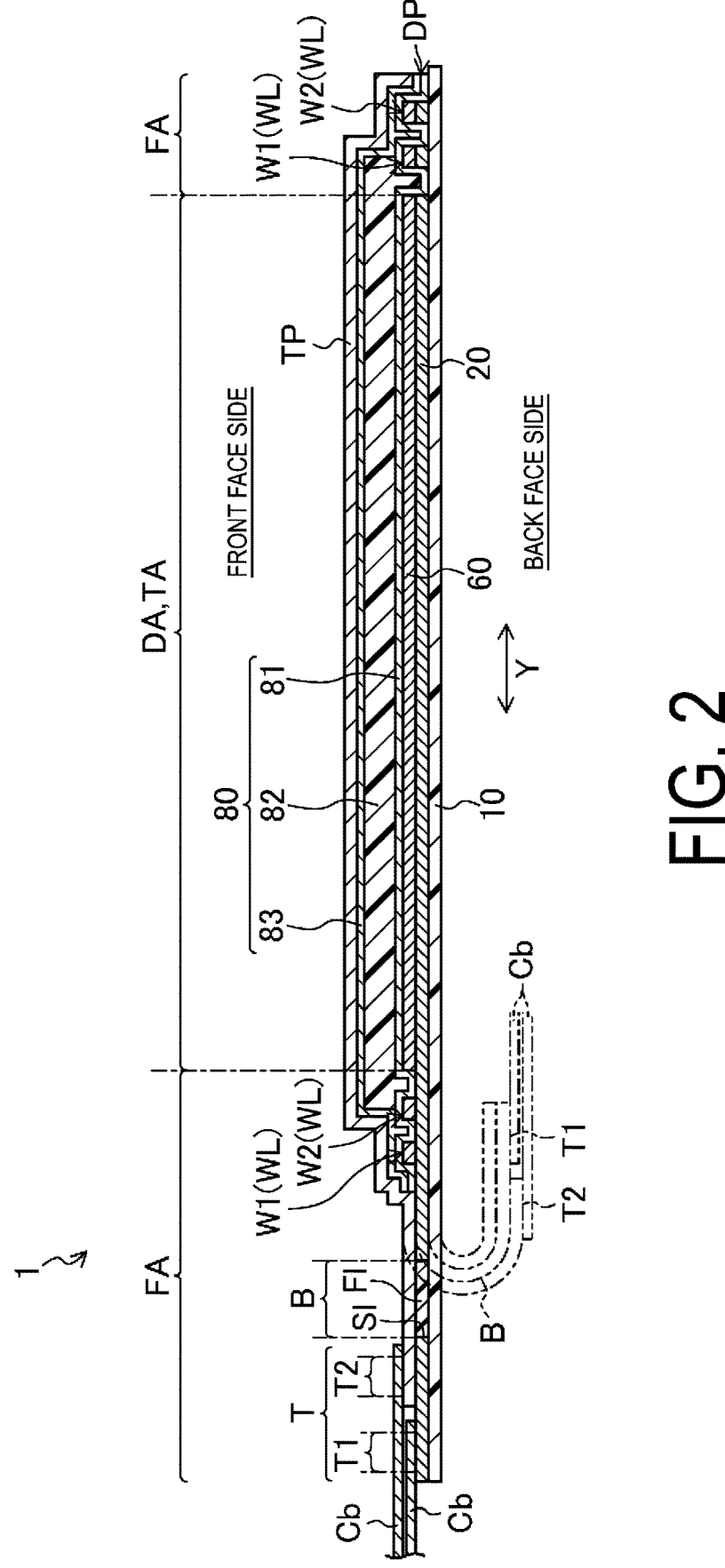
FIG. 2 is a cross-sectional view of the organic EL display device taken along line II-II in FIG. 1 (a state where the organic EL display device is bent at a bending portion is indicated by a two-dot chain line).
Figure 3:
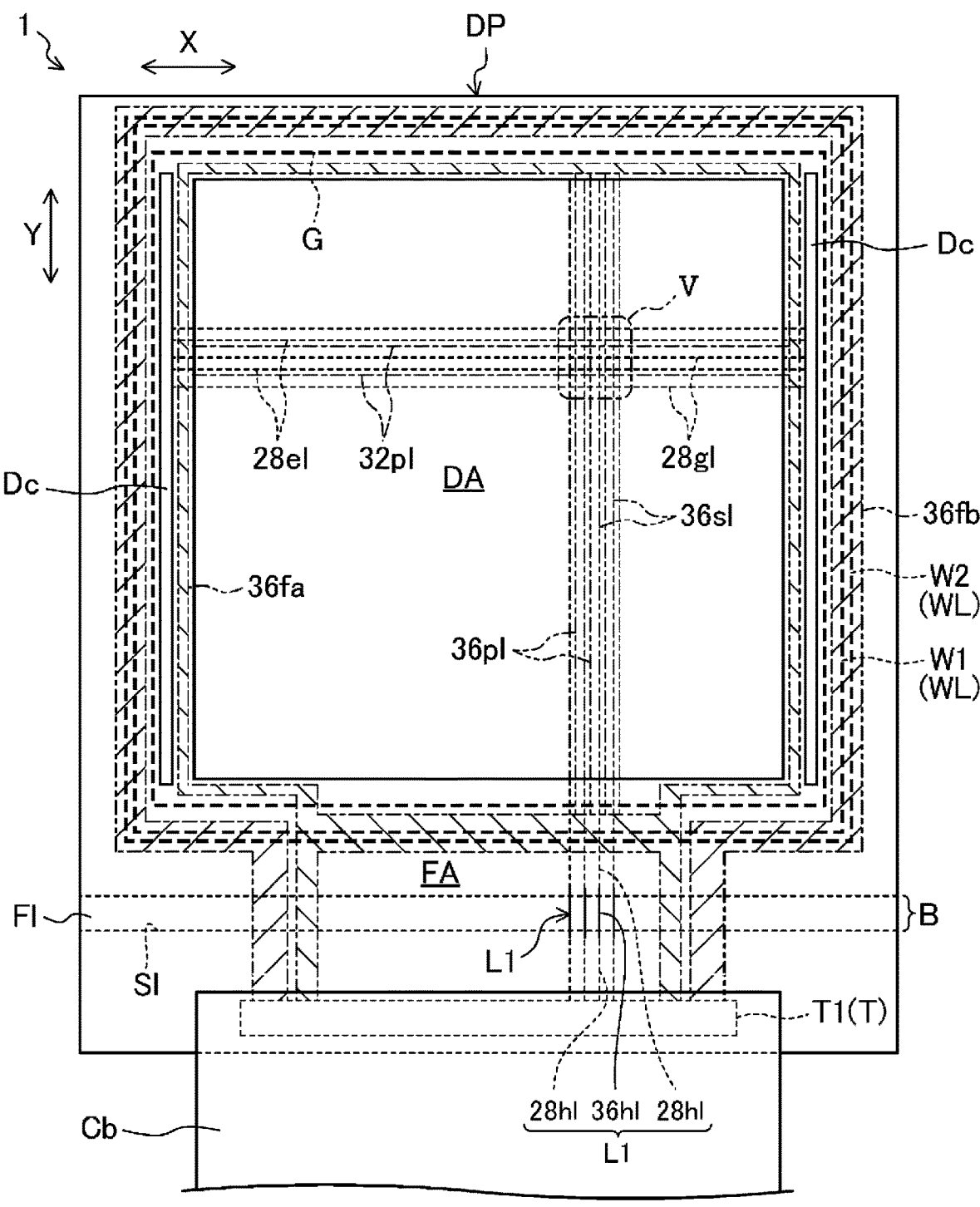
FIG. 3 is a plan view illustrating a schematic configuration of a display panel of the organic EL display device.
Figure 4:
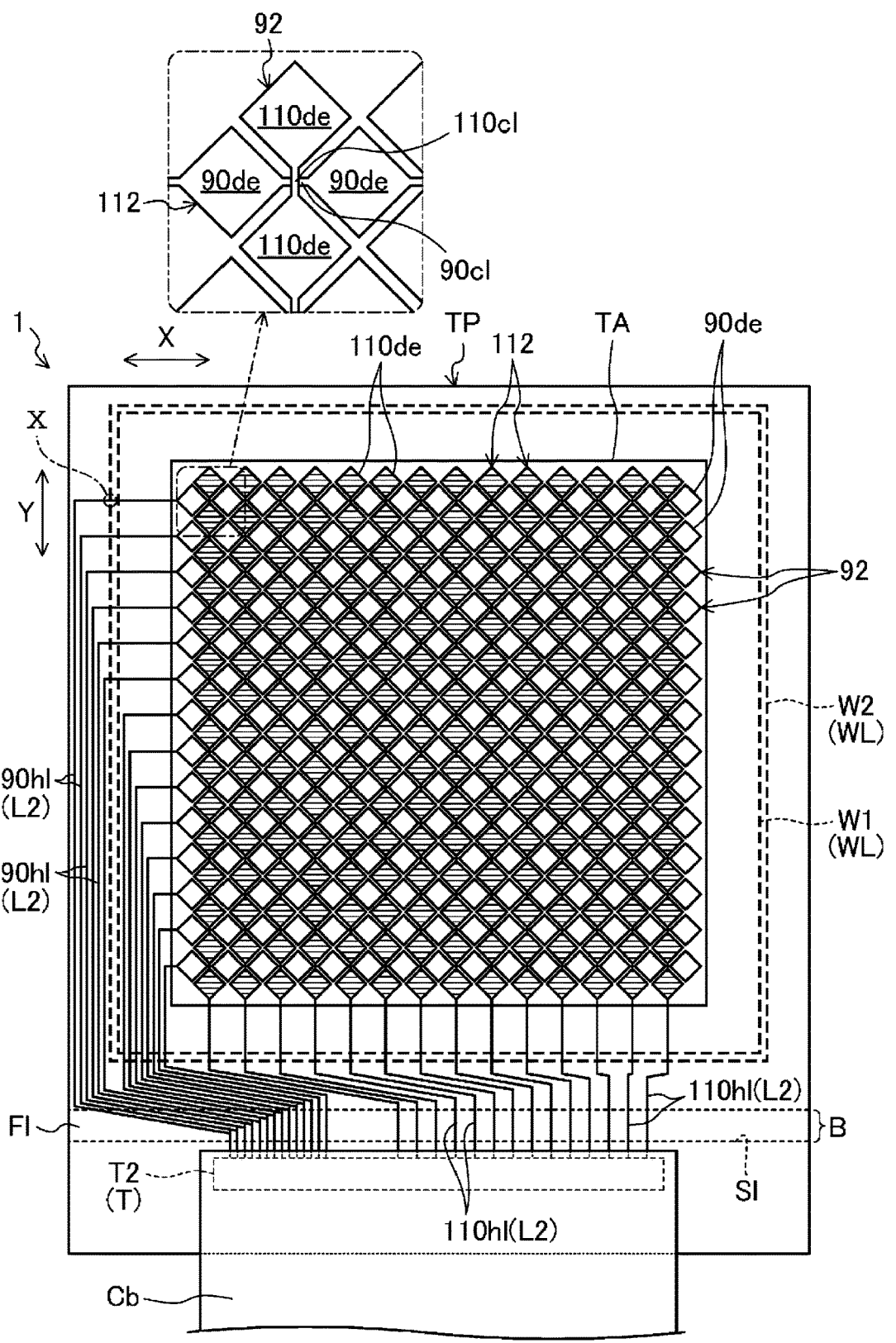
FIG. 4 is a plan view illustrating a schematic configuration of a touch panel of the organic EL display device together with a damming wall.

An organic EL display device 1 of this embodiment is used for various devices such as a display of a mobile device such as a smartphone or a tablet terminal, a monitor of a personal computer (PC), and a television device. The organic EL display device 1 illustrated in FIGS. 1 and 2 is an on-cell display device with a touch panel TP that can perform an input operation when a screen is touched.
Configuration of Organic EL Display Device The organic EL display device 1 has a function of detecting a touch position on a screen on which an image is displayed while displaying the image. The organic EL display device 1 includes a display panel DP that displays an image and a touch panel TP that detects a touch position.

The organic EL display device 1 has a display region DA for displaying an image, a touch region TA for detecting a touch position, and a frame region FA provided outside the display region DA.

Figure 5:
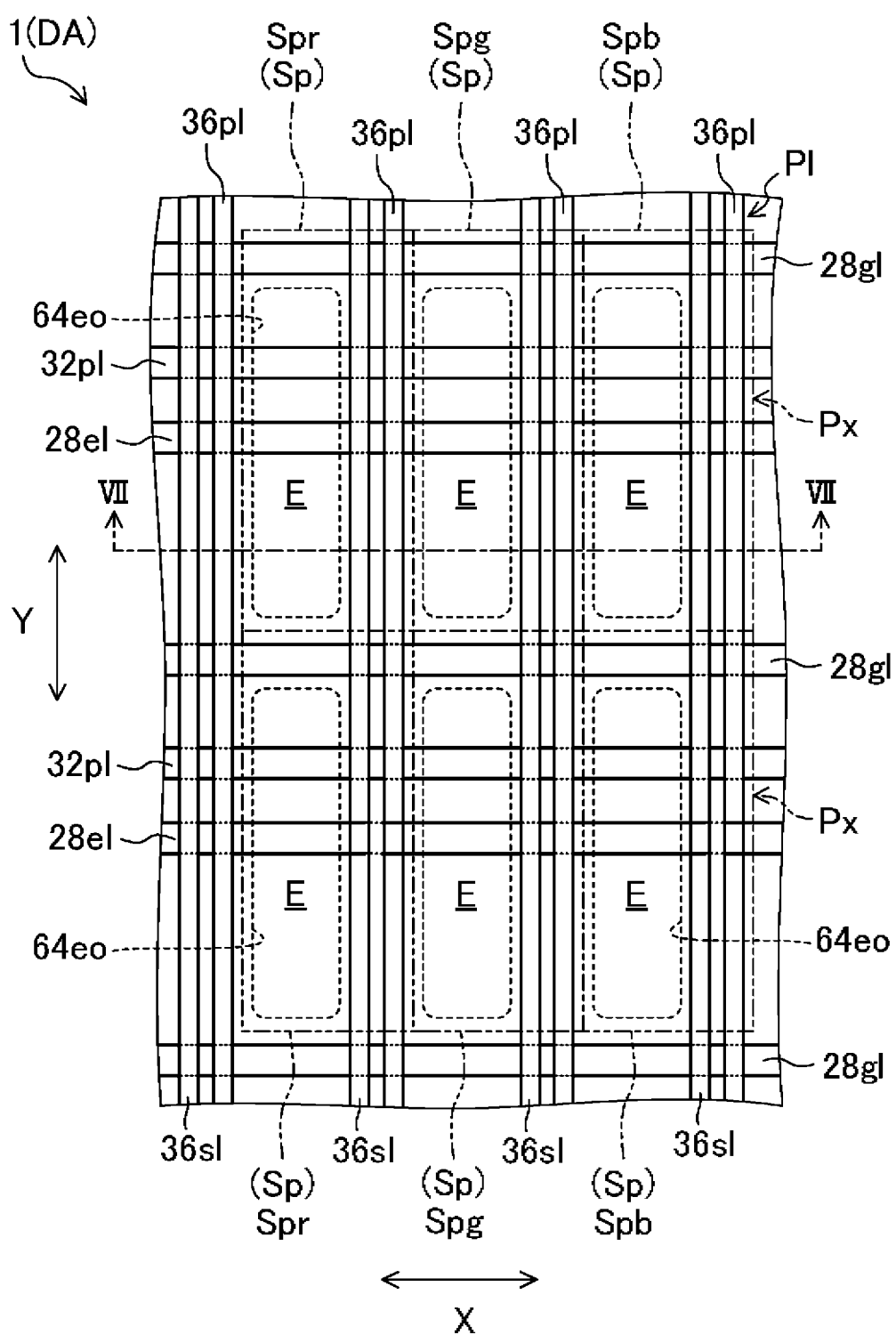
FIG. 5 is a plan view illustrating pixels constituting a display region in a part surrounded by V in FIG. 3 and various types of display wiring lines included in first to third conductive layers.

The display region DA is a rectangular region constituting the screen. In the present embodiment, the display region DA having a rectangle shape is used as an example, but the display region DA may have a substantially rectangular shape such as a shape in which at least one side is arc-shaped, a shape in which at least one corner portion is arc-shaped, or a shape having a cutout in a part of at least one side. As illustrated in FIG. 5, the display region DA is constituted by a plurality of pixels Px.

The plurality of pixels Px are arrayed in a matrix. Each of the pixels Px is constituted by three subpixels Sp. The three subpixels Sp are a subpixel Spr including a light-emitting region E that emits red light, a subpixel Spg including the light-emitting region E that emits green light, and a subpixel Spb including the light-emitting region E that emits blue light. These three subpixels Spr, Spg, and Spb are arrayed in a stripe shape, for example.

As illustrated in FIG. 1 and FIG. 2, the touch region TA is a rectangular region for detecting a position touched by a contact body such as a user's finger or a stylus. The touch region TA is set to overlap the display region DA at the same position with the same size. The shape of the touch region TA is a shape corresponding to the shape of the display region DA and may be a substantially rectangular shape as described above.

The frame region FA is a rectangular frame-shaped region constituting a non-display part other than the screen. As illustrated in FIG. 1 to FIG. 4, a part constituting one side of the frame region FA is provided with a terminal portion T for connecting to an external circuit. As the terminal portion T, a first terminal portion T1 and a second terminal portion T2 are provided. The first terminal portion T1 is provided with a plurality of terminals for supplying a signal to the display panel DP. The second terminal portion T2 is provided with a plurality of terminals for applying a voltage to the touch panel TP.

Between the display region DA and the first terminal portion T1 in the frame region FA, a bending portion B that can be bent with a first direction X, which is a lateral direction in FIG. 1, as an axis of bending is provided. In the bending portion B, a slit S1 is formed in a TFT layer 20 (strictly speaking, a layered body including a base coat film 22, a gate insulating film 26, a first interlayer insulating film 30, and a second interlayer insulating film 34) described later.

The slit S1 is provided in a groove shape penetrating the TFT layer 20 and exiting in the extending direction of the bending portion B, exposing a substrate layer 10. A filling layer F1 is provided in the slit S1. The slit S1 is filled with the filling layer F1. The filling layer F1 is formed of a resin material such as a polyimide resin, an acrylic resin, or a polysiloxane resin.

The first terminal portion T1 and the second terminal portion T2 are arranged on a back face side of the organic EL display device 1 by bending the frame region FA at, for example, 180° (in a U shape) at the bending portion B (indicated by a two-dot chain line in FIG. 2). A wiring board Cb such as a flexible printed circuit (FPC) is connected to each of the first terminal portion T1 and the second terminal portion T2.

The frame region FA is provided with a plurality of first lead-out wiring lines L1 that are lead out from the display region DA to the first terminal portion T1 in the display panel PD. Each of the plurality of first lead-out wiring lines L1 extends under a first damming wall W1 and a second damming wall W2 from the display region DA side to the outside of the frame region FA. Each of these first lead-out wiring lines L1 is constituted by a lower layer lead-out wiring line 28h1 and an upper layer lead-out wiring line 36h1.

Each of the first lead-out wiring lines L1 extends to the first terminal portion T1. Each of the first lead-out wiring lines L1 is connected to a display control circuit (not illustrated) via the wiring board Cb at the first terminal portion T1. The display control circuit is a circuit that controls image display by supplying a signal to the display wiring line (a source wiring line 36s1) included in the display panel DP and a drive circuit Dc.

In the frame region FA, a trench G is formed in a frame-like shape surrounding the display region DA in a flattening film 43 included in the display panel DP (the TFT layer 20). The trench G may be formed in a substantially C shape opening on the first terminal portion T1 side in plan view. The trench G extends through the flattening film 43 and divides the flattening film 43 partitioning the inside and the outside of the frame region FA. The trench G prevents moisture from entering the display region DA from the outside of the frame region FA.

In the frame region FA, the drive circuit Dc is monolithically provided in a part constituting a side (each of left and right sides in FIG. 1) adjacent to the side provided with the first terminal portion T1 and the second terminal portion T2. The drive circuit Dc includes a gate driver and an emission driver. The drive circuit Dc is arranged on the display region DA side relative to the trench G. The drive circuit Dc or a part thereof (the gate driver or the emission driver) may be arranged on the outer peripheral side of the frame region FA relative to the trench G.

The frame region FA is provided with a first frame wiring line 36fa (for convenience, left upward hatching is added in FIG. 3), a second frame wiring line 36fb (for convenience, right upward hatching is added in FIG. 3), the first damming wall W1, and the second damming wall W2 are. The first damming wall W1 and the second damming wall W2 are each an example of a wall body.

The first frame wiring line 36fa is provided in a frame-like shape on the display region DA side relative to the trench G and the drive circuit Dc. The first frame wiring line 36fa extends to the first terminal portion T1 on a lower layer relative to the flattening film 43 passing under the trench G. A high-level power supply voltage (ELVDD) is supplied to the first frame wiring line 36fa via the wiring board Cb at the first terminal portion T1.

The second frame wiring line 36fb is provided in a substantially C shape on the outer peripheral side of the frame region FA relative to the trench G and the drive circuit Dc. Both end portions of the second frame wiring line 36fb extend to the first terminal portion T1 along the first frame wiring line 36fa. A low-level power supply voltage (ELVSS) is supplied to the second frame wiring line 36fb via the wiring board Cb at the first terminal portion T1.

The first damming wall W1 and the second damming wall W2 have, for example, shapes similar to each other, and are arranged at intervals from each other in the width direction of the frame region FA. The first damming wall W1 is formed in a frame-like shape on the outer periphery of the trench G. The second damming wall W2 is formed in a frame-like shape on the outer periphery of the first damming wall W1. Both the first damming wall W1 and the second damming wall W2 dam an organic material from spreading to the outside of the frame region FA when the organic material is applied in the manufacturing process of the organic EL display device 1. The organic material forms an organic sealing layer 84 included in a sealing film 80.

The frame region FA is further provided with a second lead-out wiring line L2 drawn out from the touch region TA to the second terminal portion T2 in the touch panel TP. Each of the plurality of second lead-out wiring lines L2 extends across the first damming wall W1 and the second damming wall W2 from the touch region TA side to the outside of the frame region FA.

Each of the second lead-out wiring lines L2 is connected to a touch detection circuit (not illustrated) via the wiring board Cb at the second terminal portion T2. The touch detection circuit is a circuit that detects a change in electrostatic capacitance generated between electrodes included in the touch panel TP (a first detection electrode 90de and a second detection electrode 110de present at touch positions) and the contact body when the touch region TA is touched by the contact body.

Display Panel

The display panel DP adopts an active matrix driving method in which light emission at each individual subpixel Sp is controlled by a TFT 50, and image display is performed by the operation of the TFT 50. As illustrated in FIG. 2, the display panel PD includes the substrate layer 10, the TFT layer 20 provided as an upper layer of the substrate layer 10, a light-emitting element layer 60 provided as an upper layer of the TFT layer 20, and the sealing film 80 provided as an upper layer of the light-emitting element layer 60.

Substrate Layer

The substrate layer 10 is a layer forming a base of the display panel PD. The substrate layer 10 has flexibility. The substrate layer 10 is formed of a resin material such as a polyimide resin, a polyamide resin, or an epoxy resin. The substrate layer 10 may be constituted by a layered film in which an inorganic insulating layer including an inorganic material such as silicon oxide, silicon nitride, or silicon oxynitride, and a resin layer including an organic material as described above, are layered. A rear face protection film (not illustrated) is bonded to a rear face of the substrate layer 10.

TFT Layer

Figure 7:
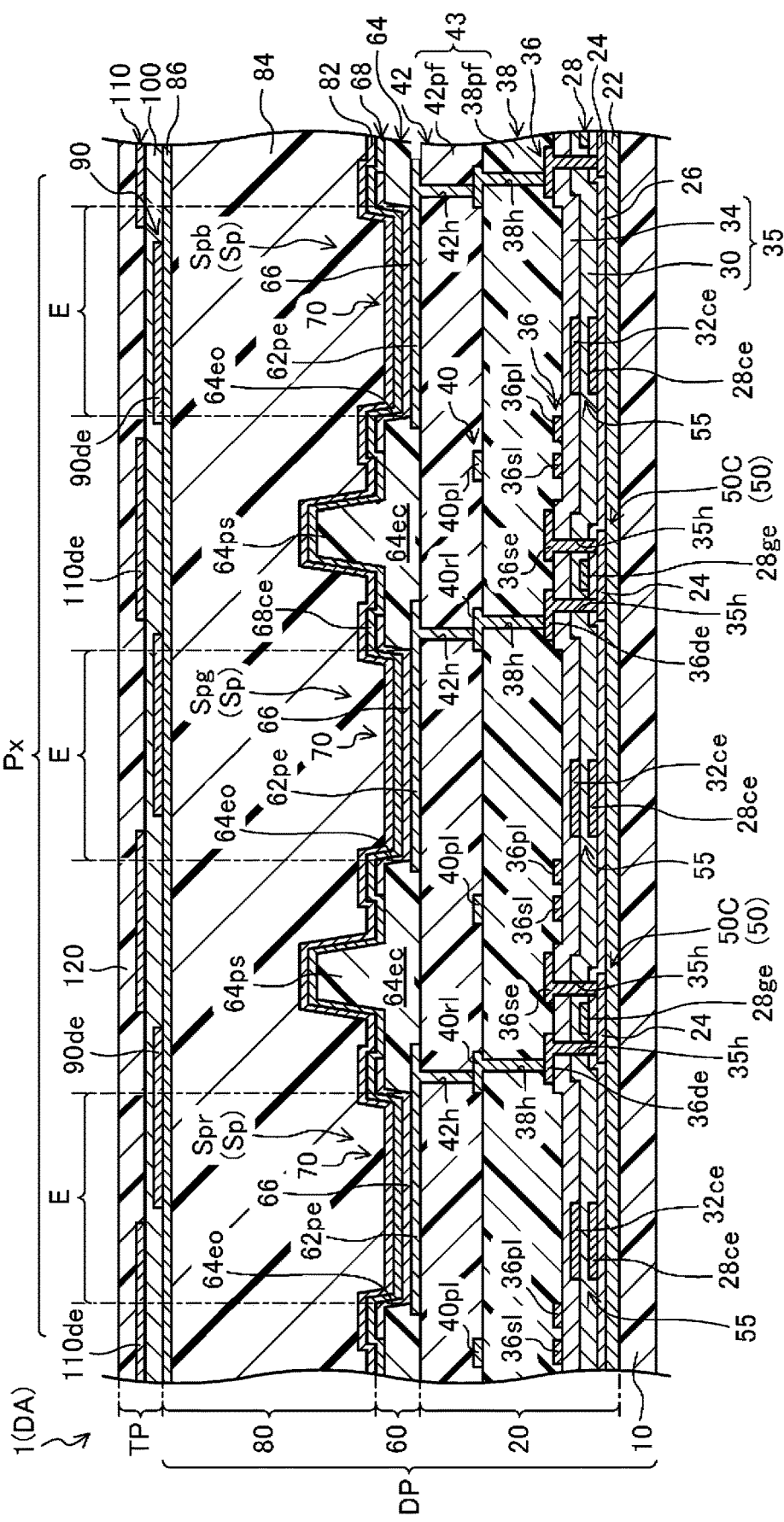
FIG. 7 is a cross-sectional view of the organic EL display device taken along line VII-VII in FIG. 5.

As illustrated in FIG. 7, the TFT layer 20 includes a plurality of TFTs 50. The TFT layer 20 includes the base coat film 22, a semiconductor layer 24, the gate insulating film 26, a first conductive layer 28, the first interlayer insulating film 30, a second conductive layer 32, the second interlayer insulating film 34, a third conductive layer 36, a first resin layer 38, a fourth conductive layer 40, and a second resin layer 42, which are sequentially provided on the substrate layer 10.

The base coat film 22 is provided over substantially the entire front face of the substrate layer 10. A plurality of semiconductor layers 24 are provided in island shapes on the base coat film 22. The gate insulating film 26 is continuously provided on the base coat film 22 covering the plurality of semiconductor layers 24. The gate insulating film 26 may be provided in an island shape on each of the semiconductor layers 24.

The first conductive layer 28 is provided on the gate insulating film 26. The first conductive layer 28 includes a plurality of gate wiring lines 28g1, a plurality of emission control wiring lines 28e1, a plurality of lower layer lead-out wiring lines 28h1, a plurality of gate electrodes 28ge, and a plurality of first capacitance electrodes 28ce. These various wiring lines and electrodes are formed of the same material on the same layer.

The first interlayer insulating film 30 is provided on the gate insulating film 26 covering the plurality of gate wiring lines 28g1, the plurality of emission control wiring lines 28e1, the plurality of lower layer lead-out wiring lines 28h1, the plurality of gate electrodes 28ge, and the plurality of first capacitance electrodes 28ce. The first interlayer insulating film 30 is an insulator interposed between the first conductive layer 28 and the second conductive layer 32.

The second conductive layer 32 is provided on the first interlayer insulating film 30. The second conductive layer 32 includes a plurality of first power source wiring lines 32p1 and a plurality of second capacitance electrodes 32ce. The first power source wiring lines 32p1 and the second capacitance electrodes 32ce are formed of the same material on the same layer.

The second interlayer insulating film 34 is provided on the first interlayer insulating film 30 covering the plurality of first power source wiring lines 32p1 and the plurality of second capacitance electrodes 32ce. The second interlayer insulating film 34 is an insulator interposed between the second conductive layer 32 and the third conductive layer 36. The first interlayer insulating film 30 and the second interlayer insulating film 34 constitute an interlayer insulating film 35.

The third conductive layer 36 is provided on the second interlayer insulating film 34. The third conductive layer 36 includes a plurality of the source wiring lines 36s1, a plurality of source electrodes 36se, a plurality of drain electrodes 36de, a plurality of second power source wiring lines 36p1, a plurality of the upper layer lead-out wiring lines 36h1, the first frame wiring line 36fa, and the second frame wiring line 36fb. These various wiring lines and electrodes are formed of the same material on the same layer.

The first resin layer 38 is provided on the second interlayer insulating film 34. The first resin layer 38 includes a first flattening film 38pf. The first flattening film 38pf covers various wiring lines and electrodes included in the third conductive layer 36 in the display region DA. The first flattening film 38pf of the present example also spreads to the frame region FA, and is provided substantially entirely in a part constituting three sides of the frame region FA except for one on the terminal portion T side.

The fourth conductive layer 40 is provided on the first resin layer 38. The fourth conductive layer 40 includes a third power source wiring line 40p1 and a plurality of relay wiring lines 40r1. The third power source wiring line 40p1 and the plurality of relay wiring lines 40r1 are formed of the same material on the same layer.

The second resin layer 42 is provided on the fourth conductive layer 40. The second resin layer 42 includes a second flattening film 42pf and a first wall layer 42w1. The second flattening film 42pf and the first wall layer 42w1 are formed of the same material on the same layer. The second flattening film 42pf covers various wiring lines included in the fourth conductive layer 40 in the display region DA. The first flattening film 38pf and the second flattening film 42pf constitute the flattening film 43. The flattening film 43 flattens the front face of the TFT layer 20.

Two first wall layers 42w1 are provided on the outer peripheral side of the flattening film 43 in the frame region FA. One of the first wall layers 42w1 constitutes the first damming wall W1. The other of the first wall layers 42w1 constitutes the second damming wall W2. The first wall layer 42w1 of the first damming wall W1 is provided on the outer periphery of the flattening film 43 at an interval from the flattening film 43. The first wall layer 42w1 of the second damming wall W2 is provided on the outer periphery of the first damming wall W1 at an interval from the first wall layer 42w1 of the first damming wall W1.

The base coat film 22, the gate insulating film 26, the first interlayer insulating film 30, and the second interlayer insulating film 34 include an inorganic insulating material such as silicon oxide, silicon nitride, or silicon oxynitride. The base coat film 22, the gate insulating film 26, the first interlayer insulating film 30, and the second interlayer insulating film 34 are constituted by a single-layer film or a layered film including such an inorganic insulating material.

The semiconductor layer 24 is formed of, for example, low temperature polycrystalline silicon (LTPS). The semiconductor layer 24 includes an oxide semiconductor such as indium gallium zinc oxide (In—Ga—Zn—O) or another semiconductor material. The first flattening film 38pf, the second flattening film 42pf, and first wall layer 42wl include, for example, a resin material such as a polyimide resin or an acrylic resin.

The various wiring lines and electrodes included in the first conductive layer 28, the second conductive layer 32, the third conductive layer 36, and the fourth conductive layer 40 include a conductive material such as aluminum (Al), tungsten (W), molybdenum (Mo), tantalum (Ta), chromium (Cr), titanium (Ti), or copper (Cu). These various wiring lines and electrodes are constituted by a single-layer film or a layered film including such a conductive material.

Wiring Line

As illustrated in FIG. 5, the plurality of gate wiring lines 28g1 extend in parallel to each other in the first direction X at intervals in a second direction Y, which is a direction orthogonal to the first direction X, in the display region DA. Each of the gate wiring lines 28g1 is a display wiring line through which a gate signal is transmitted, and is provided for each row of the subpixels Sp. Each of the gate wiring lines 28g1 is connected to the gate driver of the drive circuit Dc.

The plurality of emission control wiring lines 28e1 extend in parallel to each other in the first direction X at intervals in the second direction Y in the display region DA. Each of the emission control wiring lines 28e1 is a display wiring line through which an emission control signal is transmitted, and is provided for each row of the subpixels Sp. Each of the emission control wiring lines 28e1 is connected to the emission driver of the drive circuit Dc.

The plurality of source wiring lines 36s1 extend in parallel to each other in the second direction Y at intervals in the first direction X in the display region DA. Each of the source wiring lines 36s1 is a display wiring line through which a source signal is transmitted, and is provided for each column of the subpixels Sp. Each of the source wiring lines 36s1 is connected to the first lead-out wiring line L1 and is connected to the display control circuit via the first terminal portion T1.

Figure 6:
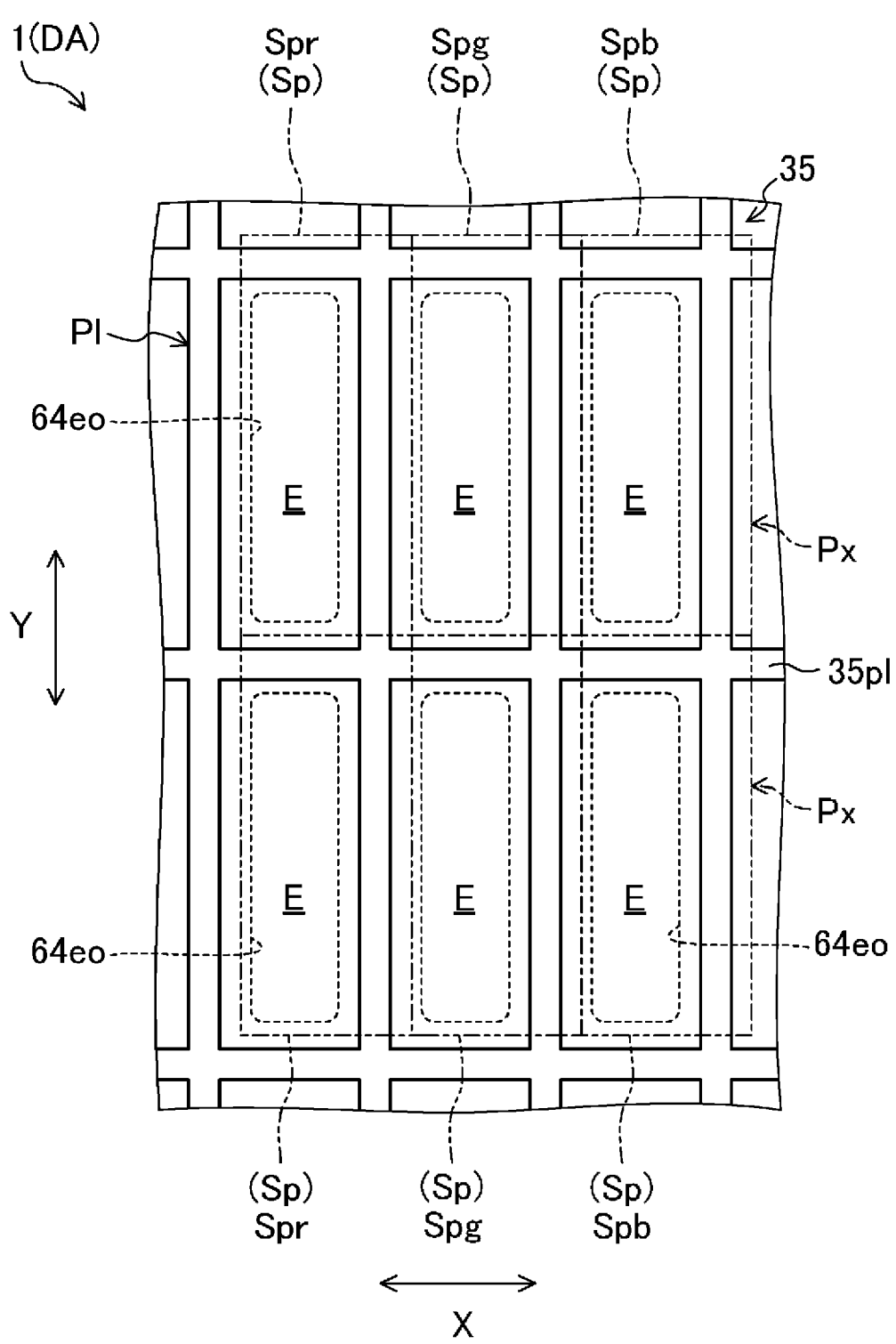
FIG. 6 is a plan view illustrating pixels constituting a display region in a part corresponding to that in FIG. 5 and display wiring lines included in a fourth conductive layer.

The plurality of first power source wiring lines 32p1 extend in parallel to each other in the first direction X at intervals in the second direction Y in the display region DA. The plurality of second power source wiring lines 36p1 extend in parallel to each other in the second direction Y at intervals in the first direction X in the display region DA. As illustrated in FIG. 6, the third power source wiring line 40p1 extends in a lattice pattern in the first direction X and the second direction Y.

Each of the first power source wiring lines 32p1, each of the second power source wiring lines 36p1, and the third power source wiring line 40p1 are display wiring lines to which a predetermined high-level power supply voltage (ELVDD) is applied. Each of the first power source wiring lines 32p1, each of the second power source wiring lines 36p1, and the third power source wiring line 40p1 constitute a power source wiring line P1. Each of the first power source wiring lines 32p1 is connected to each of the second power source wiring lines 36p1 and the first frame wiring line 36fa via contact holes (not illustrated) formed in the second interlayer insulating film 34. Each of the second power source wiring lines 36p1 is connected to the first frame wiring line 36fa. The third power source wiring line 40p1 is connected to each of the second power source wiring lines 36p1 via contact holes (not illustrated) formed in the first flattening film 38pf, or is connected to the first frame wiring line 36fa outside the first flattening film 38pf.

The plurality of lower layer lead-out wiring lines 28h1 are provided in the frame region FA at intervals in the first direction X in a part between the display region DA and the bending portion B and a part between the bending portion B and the first terminal portion T1, and extend in both portions B and T1 in parallel to each other in the second direction Y. Each of the lower layer lead-out wiring lines 28h1 positioned on the display region DA side relative to the bending portion B is connected to the corresponding source wiring line 36s1 via a contact hole (not illustrated) formed in the interlayer insulating film 35.

The plurality of upper layer lead-out wiring lines 36h1 are provided in the frame region FA at intervals in the first direction X, and extend in parallel to each other in the second direction Y on the filling layer F1 across the bending portion B. Each of the upper layer lead-out wiring lines 36h1 is connected to each of the lower layer lead-out wiring lines 28h1 positioned on the display region DA side relative to the bending portion B and the lower layer lead-out wiring line 28h1 positioned on the first terminal portion T1 side relative to the bending portion B via a contact hole (not illustrated) formed on the interlayer insulating film 35.

The plurality of relay wiring lines 40r1 are provided on the first flattening film 38pf in the display region DA. The relay wiring line 40r1 is formed in an island shape for each of the subpixels Sp. Each of the relay wiring lines 40r1 relays connection between the drain electrode 36de of the predetermined TFT 50 and an electrode of an organic EL element 70. Specifically, each of the relay wiring lines 40r1 is connected to the drain electrode 36de of a third TFT 50C via a contact hole 38h formed on the first flattening film 38pf. A pixel electrode 62pe constituting the organic EL element 70 is connected to each of the relay wiring lines 40r1 via a contact hole 42h formed in the second flattening film 42pf.

Electrode and Element

A plurality of the gate electrodes 28ge, a plurality of the source electrodes 36se, and a plurality of the drain electrodes 36de are provided for each of the subpixels Sp. The gate electrode 28ge, the source electrode 36se, and the drain electrode 36de constitute the TFT 50. A plurality of the TFTs 50 are provided for each of the subpixels Sp. The plurality of TFTs 50 are each configured as a top gate TFT.

Each of the TFTs 50 is constituted by the semiconductor layer 24, the gate insulating film 26, the gate electrode 28ge, the interlayer insulating film 35, the source electrode 36se, and the drain electrode 36de. The source electrode 36se and the drain electrode 36de are separated from each other and connected to parts (conduction areas) different from each other at positions with an area (intrinsic region) overlapping the gate electrode 28ge in the semiconductor layer 24 interposed therebetween, via a contact hole 35h formed in the interlayer insulating film 35.

At least one of the first capacitance electrodes 28ce and at least one of the second capacitance electrodes 32ce are provided for each of the subpixels Sp. The first capacitance electrode 28ce and the second capacitance electrode 32ce constitute a capacitor 55. At least one capacitor 55 is provided for each of the subpixels Sp. The capacitor 55 is an element for holding data. The capacitor 55 is constituted by the first capacitance electrode 28ce, the first interlayer insulating film 30, and the second capacitance electrode 32ce. The first capacitance electrode 28ce and the second capacitance electrode 32ce overlap each other via the first interlayer insulating film 30.

Light-Emitting Element Layer

The light-emitting element layer 60 is provided on the TFT layer 20. That is, the light-emitting element layer 60 is supported by the substrate layer 10 via the TFT layer 20. The light-emitting element layer 60 includes a plurality of the organic electro luminescence elements (organic EL elements) 70. The organic EL element 70 is an example of a light-emitting element. The light-emitting element layer 60 includes a fifth conductive layer 62, a third resin layer 64, an organic EL layer 66, and a sixth conductive layer 68, which are sequentially provided on the second resin layer 42.

The fifth conductive layer 62 includes a plurality of the pixel electrodes 62pe. The pixel electrode 62pe is provided for each of the subpixels Sp. The pixel electrode 62pe functions as an anode electrode for injecting a hole into the organic EL layer 66. The pixel electrode 62pe has light reflectivity for reflecting light.

As a material of the pixel electrode 62pe, for example, a conductive material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn) is used.

The material of the pixel electrode 62pe may be an alloy such as astatine (At) and astatine oxide (AtO$_2$). The material of the pixel electrode 62pe may be a conductive oxide such as tin oxide (SnO), zinc oxide (ZnO), indium tin oxide (ITO), or indium zinc oxide (IZO). The material of the pixel electrode 62pe is preferably a material having a large work function to improve efficiency of injecting holes into the organic EL layer 66. The pixel electrode 62pe may be formed by layering a plurality of layers including a conductive material as described above.

The third resin layer 64 includes edge covers 64ec, photo spacers 64ps, and a second wall layer 64w1. The edge cover 64ec, the photo spacer 64ps, and the second wall layer 64w1 are formed of the same material on the same layer. As the material of the edge cover 64ec, the photo spacer 64ps, and the second wall layer 64w1, for example, a resin material such as a polyimide resin, an acrylic resin, a polysiloxane resin, or a novolak resin is used.

The edge cover 64ec sections the pixel electrodes 62pe adjacent to each other. The edge cover 64ec is formed in a lattice pattern as a whole and covers a peripheral portion of each of the pixel electrodes 62pe. Openings 64eo for exposing each of the pixel electrodes 62pe is formed in the edge cover 64ec. A part of the front face of the edge cover 64ec constitutes a plurality of the photo spacers 64ps protruding upward. The second wall layer 64w1 is divided into two and provided on each of the first wall layers 42w1 in the frame region FA. One of the second wall layers 64w1 constitutes the first damming wall W1. The other of the second wall layers 64w1 constitutes the second damming wall W2.

Figure 8:
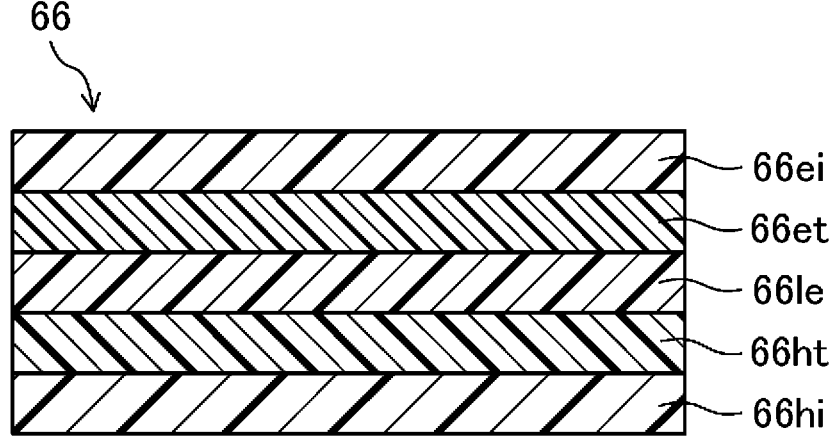
FIG. 8 is a cross-sectional view illustrating a layered structure of an organic EL layer of the organic EL display device.

The organic EL layer 66 is an example of a light-emitting function layer. The organic EL layer 66 is provided on the individual pixel electrodes 62pe in each opening 64eo of the edge cover 64ec. As illustrated in FIG. 8, the organic EL layer 66 has a hole injection layer 66hi, a hole transport layer 66ht, a light-emitting layer 661e, an electron transport layer 66et, and an electron injection layer 66ei, which are sequentially provided on the pixel electrode 62pe. Some layers among the hole injection layer 66hi, the hole transport layer 66ht, the light-emitting layer 661e, the electron transport layer 66et, and the electron injection layer 66ei may be continuously provided in common in a plurality of the subpixels Sp.

The hole injection layer 66hi is also referred to as an anode electrode buffer layer. The hole injection layer 66hi brings energy levels of the pixel electrode 62pe and the organic EL layer 66 close to each other, and improves efficiency of injecting holes from the pixel electrode 62pe into the organic EL layer 66. As the material of the hole injection layer 66hi, for example, a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, or a stilbene derivative is used.

The hole transport layer 66ht efficiently moves holes to the light-emitting layer 661e. As the material of the hole transport layer 66ht, a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon, zinc sulfide, or zinc selenide is used.

When a current is applied by the pixel electrode 62pe and a common electrode 68ce, the light-emitting layer 661e recombines holes injected from the pixel electrode 62pe and electrons injected from the common electrode 68ce to emit light. The light-emitting layer 661e is formed of, for example, a different material suited to the light-emission color (red, green or blue) of the organic EL element 70 in each subpixel Sp.

As the material of the light-emitting layer 661e, for example, a metal oxinoid compound [8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an amipylene derivative, a pyridine derivative, a rhodamine derivative, an aquidine derivative, phenoxazone, a quinacridone derivative, rubrene, poly-p-phenylenevinylene, or polysilane is used.

The electron transport layer 66et efficiently moves electrons to the light-emitting layer 661e. As the material of the electron transport layer 66et, for example, an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound is used.

The electron injection layer 66ei is also called a cathode electrode buffer. The electron injection layer 66ei brings energy levels of the common electrode 68ce and the organic EL layer 66 close to each other, and improves efficiency of injecting electrons from the common electrode 68ce into the organic EL layer 66. As the material of the electron injection layer 66ei, for example, an inorganic alkali compound such as lithium fluoride (LiF), magnesium fluoride (MgF$_2$), calcium fluoride (CaF$_2$), strontium fluoride (SrF$_2$), or barium fluoride (BaF$_2$), aluminum oxide (Al$_2$O$_3$), or strontium oxide (SrO) is used.

The sixth conductive layer 68 includes the common electrode 68ce. The common electrode 68ce is continuously provided in common to the plurality of subpixels Sp. The common electrode 68ce is provided on the organic EL layer 66 covering the edge cover 64ec, and overlaps each of the pixel electrodes 62pe via the organic EL layer 66. The common electrode 68ce functions as a cathode electrode for injecting electrons into the organic EL layer 66. The common electrode 68ce has optical transparency for transmitting light.

As the material of the common electrode 68ce, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF) is used.

The common electrode 68ce may be formed of an alloy of magnesium (Mg) and copper (Cu), magnesium (Mg) and silver (Ag), sodium (Na) and potassium (K), astatine (At) and astatine oxide (AtO$_2$), lithium (Li) and aluminum (Al), lithium (Li), calcium (Ca), and aluminum (Al), or lithium fluoride (LiF), calcium (Ca), and aluminum (Al).

Organic EL Element

The organic EL element 70 is provided for each of the subpixels Sp. The plurality of organic EL elements 70 are each configured as a top emission type. Each of the organic EL elements 70 has the pixel electrode 62pe, the organic EL layer 66, and the common electrode 68ce. In the organic EL element 70, when a current is applied between the pixel electrode 62pe and the common electrode 68ce, the organic EL layer 66 emits light. The organic EL element 70 emits light in a region corresponding to each opening 64eo of the edge cover 64ec.

The pixel electrode 62pe is connected via the relay wiring line 40r1 to the drain electrode 36de of the predetermined TFT 50 (the third TFT 50C) in the corresponding subpixel Sp. The organic EL layer 66 is held between the pixel electrode 62pe and the common electrode 68ce. The common electrode 68ce extends to the frame region FA, and is connected to the second frame wiring line 36fb between the flattening film 43 and the first damming wall W1 and/or between the first damming wall W1 and the second damming wall W2.

Pixel Circuit

Figure 9:
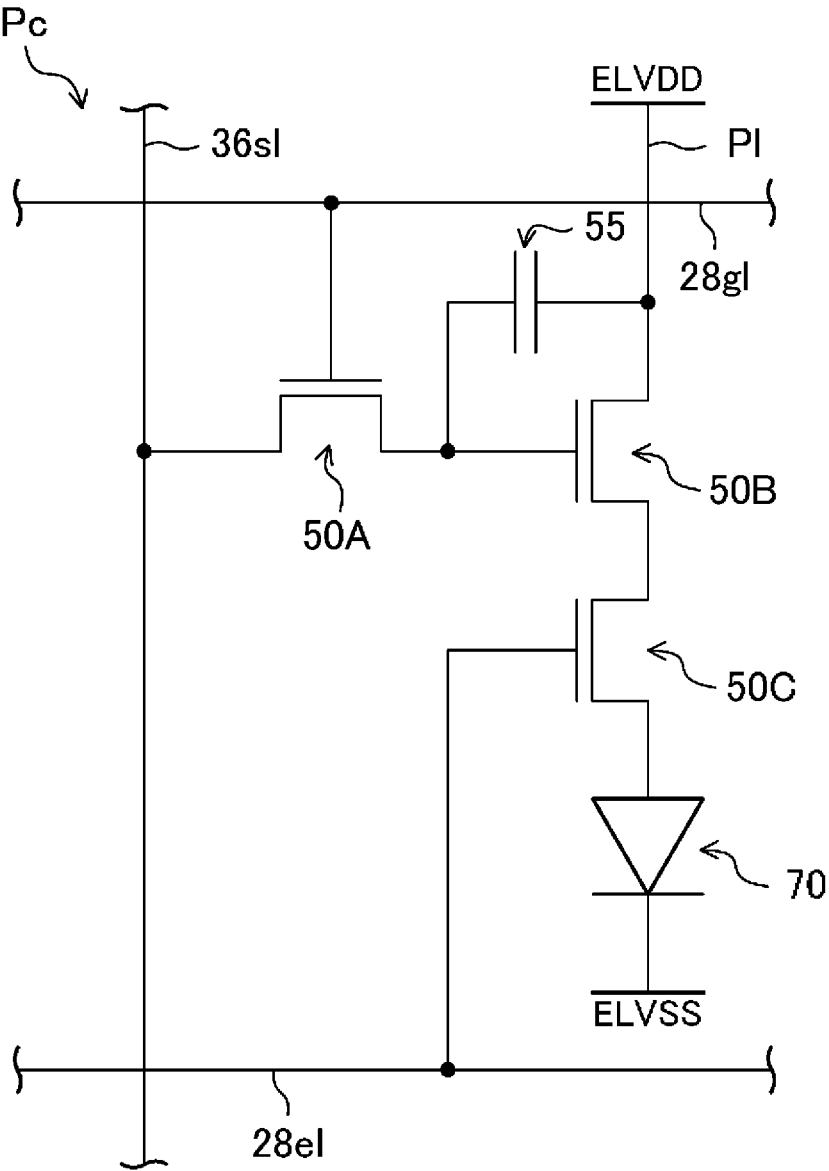
FIG. 9 is an equivalent circuit diagram illustrating a pixel circuit of the organic EL display device.

The plurality of TFTs 50, the capacitor 55, and the organic EL element 70 that are provided for each of the subpixels Sp constitute a pixel circuit Pc as illustrated in FIG. 9. The pixel circuit Pc controls light emission of the organic EL element 70 provided in the corresponding subpixel Sp on the basis of a gate signal supplied to the gate wiring line 28g1, an emission signal supplied to the emission control wiring line 28e1, a source signal supplied to the source wiring line 36s1, a high-level power supply voltage supplied to the power source wiring line P1, and a low-level power supply voltage supplied to the common electrode 68ce.

The plurality of TFTs 50 constituting the pixel circuit Pc are a first TFT 50A, a second TFT 50B, and the third TFT 50C. The first TFT 50A is connected to the corresponding gate wiring line 28g1, the source wiring line 36s1, and the second TFT 50B in each of the subpixels Sp. The second TFT 50B is connected to the corresponding first TFT 50A, the power source wiring line P1, and the third TFT 50C in each of the subpixels Sp. The third TFT 50C is connected to the corresponding second TFT 50B, the emission control wiring line 28e1, and the organic EL element 70 in the subpixel Sp. The capacitor 55 is connected to the corresponding first TFT 50A, the second TFT 50B, and the power source wiring line P1 in each of the subpixels Sp.

Sealing Film

The sealing film 80 is provided on the light-emitting element layer 60 covering the plurality of organic EL elements 70. The sealing film 80 protects each of the organic EL elements 70 (in particular, the organic EL layer 66) from moisture, oxygen, and the like. The sealing film 80 includes a first inorganic sealing layer 82, an organic sealing layer 84, and a second inorganic sealing layer 86, which are sequentially provided on the light-emitting element layer 60.

The first inorganic sealing layer 82 covers the common electrode 68ce in the display region DA, covers the first damming wall W1 and the second damming wall W2 in the frame region FA, and extends to the outer peripheral side of the second damming wall W2. The organic sealing layer 84 is provided inside the first damming wall W1 on the first inorganic sealing layer 82. The organic sealing layer 84 may exist between the first damming wall W1 and the second damming wall W2.

The second inorganic sealing layer 86 covers the organic sealing layer 84 and extends to the outer peripheral side of the second damming wall W2. The peripheral portion of the second inorganic sealing layer 86 is overlapped and joined to the peripheral portion of the first inorganic sealing layer 82 on the outer peripheral side of the first damming wall W1. Accordingly, the organic sealing layer 84 is wrapped by the first inorganic sealing layer 82 and the second inorganic sealing layer 86, and sealed between those two layers 82 and 86.

The first inorganic sealing layer 82 and the second inorganic sealing layer 86 each include an inorganic insulating material such as, for example, silicon oxide, silicon nitride, or silicon oxynitride. The organic sealing layer 84 includes a resin material such as, for example, an acrylic resin, an epoxy resin, a silicone resin, a polyurea resin, a parylene resin, a polyimide resin, or a polyamide resin.

Touch Panel

The touch panel TP adopts a projected electrostatic capacitance method (projected capacitive method). The touch panel TP includes a seventh conductive layer 90 provided as an upper layer of the display panel DP, an interlayer insulating film 100 provided as an upper layer of the seventh conductive layer 90, an eighth conductive layer 110 provided as an upper layer of the interlayer insulating film 100, and an overcoat film 120.

The seventh conductive layer 90 is provided on the sealing film 80. The seventh conductive layer 90 includes a plurality of the first detection electrodes 90de, a plurality of first coupling wiring lines 90c1, and a plurality of lower layer lead-out wiring lines 90h1. The plurality of first detection electrodes 90de, the plurality of first coupling wiring lines 90c1, and the plurality of lower layer lead-out wiring lines 90h1 are formed of the same material on the same layer.

The interlayer insulating film 100 is provided on the seventh conductive layer 90. The interlayer insulating film 100 is provided covering the plurality of first detection electrodes 90de and the plurality of first coupling wiring lines 90c1. The interlayer insulating film 100 is an insulator interposed between the seventh conductive layer 90 and the eighth conductive layer 110. The interlayer insulating film 100 may be provided covering only each of the first coupling wiring lines 90c1 and the periphery thereof.

The eighth conductive layer 110 is provided on the interlayer insulating film 100. The eighth conductive layer 110 includes a plurality of the second detection electrodes 110de, a plurality of second coupling wiring lines 110c1, and a plurality of upper layer lead-out wiring lines 110h1. The plurality of second detection electrodes 110de, the plurality of second coupling wiring lines 110c1, and the plurality of upper layer lead-out wiring lines 110h1 are formed of the same material on the same layer.

The overcoat film 120 is provided on the eighth conductive layer 110. The overcoat film 120 is provided covering the plurality of second detection electrodes 110de and the plurality of second coupling wiring lines 110c1 in the touch region TA, and covering the plurality of upper layer lead-out wiring lines 110h1 at a position excluding the second terminal portion T2 in the frame region FA.

The various wiring lines and electrodes included in the seventh conductive layer 90 and the eighth conductive layer 110 include a conductive oxide having optical transparency, such as indium tin oxide (ITO) or indium zinc oxide (IZO). These various wiring lines and electrodes are constituted by a single-layer film or a layered film including such a conductive oxide.

The interlayer insulating film 100 includes an inorganic insulating material such as, for example, silicon oxide, silicon nitride, or silicon oxynitride. The interlayer insulating film 100 is constituted by a single-layer film or a layered film including such an inorganic insulating material. The overcoat film 120 includes a resin material having optical transparency, such as an acrylic resin.

Touch Position Detection Electrode

The first detection electrode 90*de* and the second detection electrode 110*de* are each an electrode for touch position detection. The plurality of first detection electrodes 90*de* are arranged in a matrix in the touch region TA. The plurality of second detection electrodes 110*de* are also arranged in a matrix in the touch region TA. The first detection electrode 90*de* and the second detection electrode 110*de* are alternately arrayed side by side in an oblique direction with respect to the first direction X and the second direction Y.

The first detection electrode 90*de* is formed in, for example, a rhombus shape. The corner portions of the first detection electrode 90*de* adjacent in the first direction X and the second direction Y face each other. Further, the corner portions of the first detection electrodes 90*de* adjacent to each other in the first direction X are coupled to each other via the first coupling wiring line 90*c*1. The plurality of first detection electrodes 90*de* aligned in the first direction X constitute a first electrode group 92 connected to each other. The first electrode groups 92 are arranged in a plurality of columns in the second direction Y.

The second detection electrode 110*de* is also formed in, for example, a rhombus shape. The corner portions of the second detection electrodes 110*de* adjacent to each other in the first direction X and the second direction Y face each other. Further, the corner portions of the second detection electrodes 110*de* adjacent to each other in the second direction Y are coupled to each other via the second coupling wiring line 110*c*1. The plurality of second detection electrodes 110*de* aligned in the second direction Y constitute second electrode groups 112 that are connected to each other. The second electrode groups 112 are arranged in a plurality of columns in the first direction X.

Each of the upper layer lead-out wiring lines 90*h*1 is routed from the touch region TA to the second terminal portion T2 via a part constituting a side on one side (left side in the example illustrated in FIG. 4) in the first direction X of the frame region FA. Some of the upper layer lead-out wiring lines 90*h*1 may be routed from the touch region TA to the second terminal portion T2 via a part constituting a side on the other side (right side in FIG. 4) in the first direction X of the frame region FA.

In each of the lower layer lead-out wiring lines 110*h*1, a part constituting a side on the second terminal portion T2 side in the frame region FA is drawn out to the second terminal portion T2. Each of the lower layer lead-out wiring lines 90*h*1 and the upper layer lead-out wiring lines 110*h*1 constitutes the second lead-out wiring line L2. The second lead-out wiring line L2 intersects the second damming wall W2 and extends on the sealing film 80 (second inorganic sealing layer 86) across the second damming wall W2.

First Damming Wall and Second Damming Wall

The first damming wall W1 and the second damming wall W2 are damming walls WL (hereinafter, comprehensively referred to as damming wall WL) having the same configuration. Hereinafter, the configuration of the first damming wall W1 and the second damming wall W2 is illustrated in FIG. 10 to FIG. 12, with the second damming wall W2 used as an example.

Figure 10:
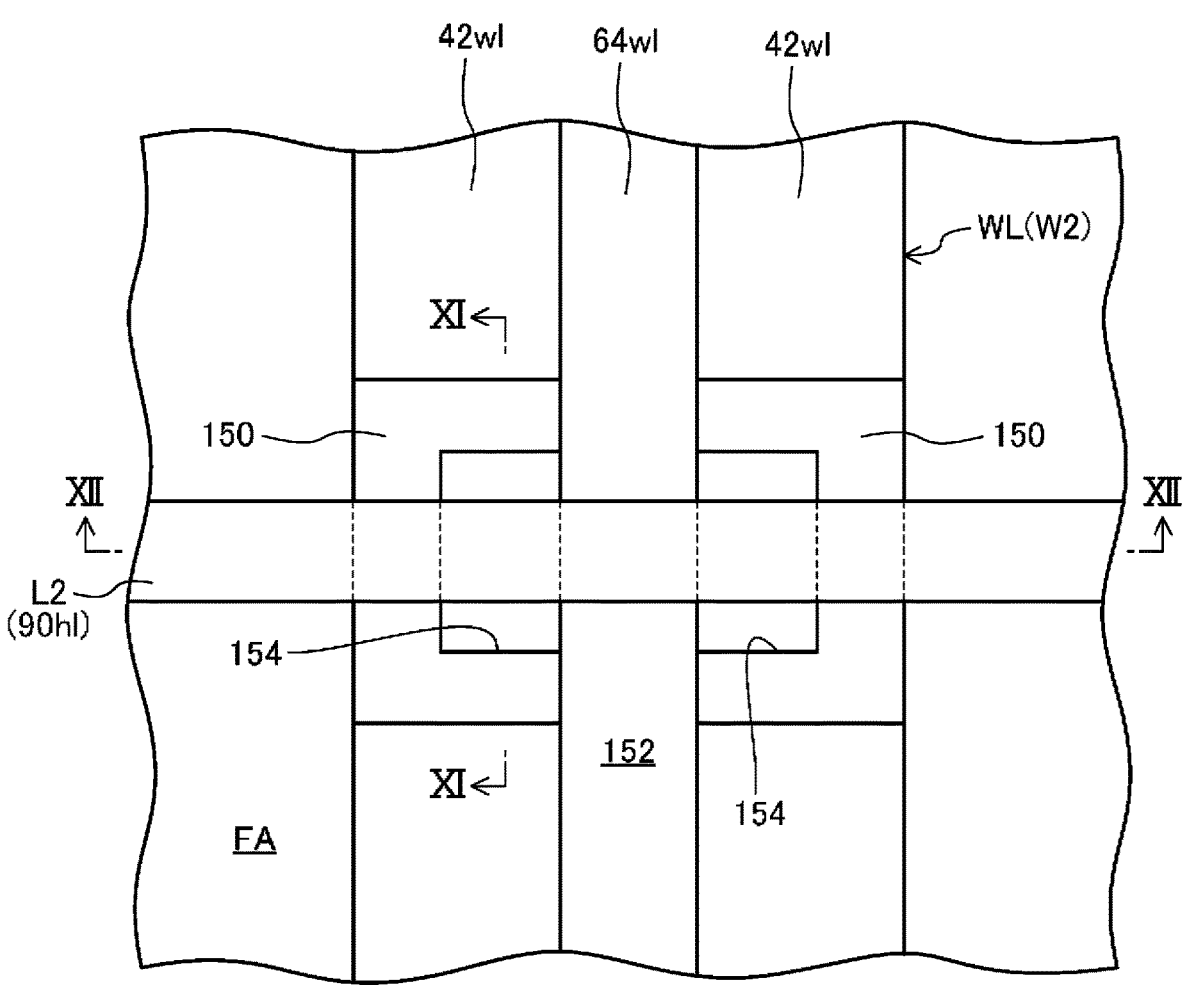
FIG. 10 is a plan view illustrating a schematic configuration of a part surrounded by X in FIG. 4.
Figure 11:
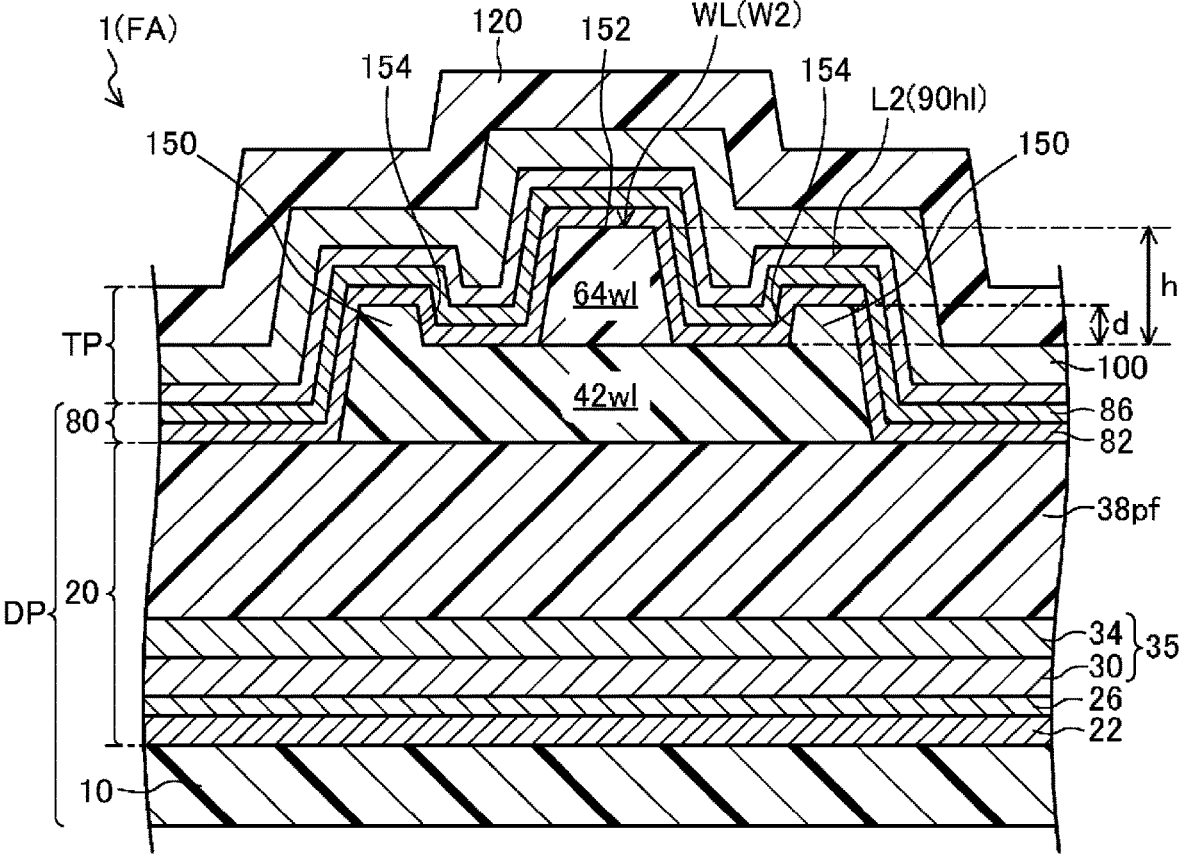
FIG. 11 is a cross-sectional view of the organic EL display device taken along line XI-XI in FIG. 10.
Figure 12:
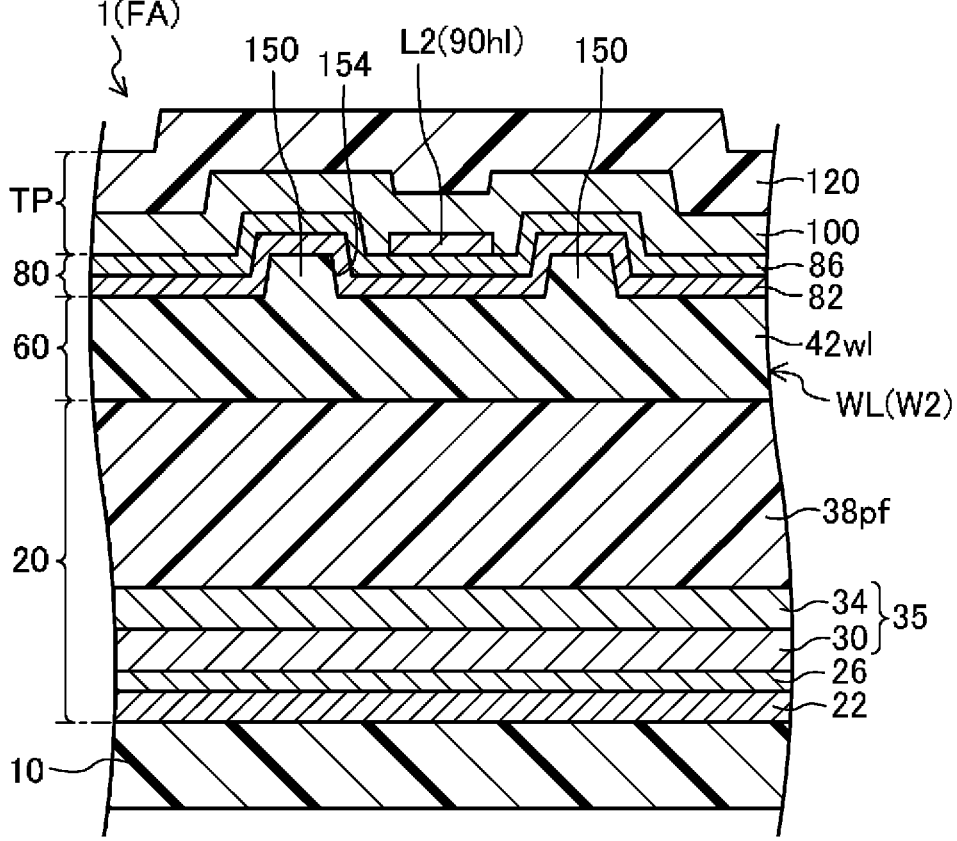
FIG. 12 is a cross-sectional view of the organic EL display device taken along line XII-XII in FIG. 10.

As illustrated in FIG. 10 to FIG. 12, the damming wall WL includes the first wall layer 42*w*1 and the second wall layer 64*w*1. The first wall layer 42*w*1 is supported by the substrate layer 10 via a lower layer part of the TFT layer 20 such as the first flattening film 38*pf*. The second wall layer 64*w*1 is provided on the first wall layer 42*w*1. The width of the second wall layer 64*w*1 is smaller than the width of the first wall layer 42*w*1. In the width direction of the second damming wall W2, both side parts of the first wall layer 42*w*1 extend to the inside and the outside of the second wall layer 64*w*1 in plan view.

The damming wall WL has a bank portion 150 having a projecting shape. The bank portion 150 is provided for each of the second lead-out wiring lines L2. In a part where the second lead-out wiring line L2 extends, the bank portion 150 is provided separately on both sides in the direction in which the second lead-out wiring line L2 extends with respect to a top portion 152 of the damming wall WL, that is, on both sides in the width direction of the damming wall WL. The bank portion 150 of the present example is constituted by the first wall layer 42*w*1.

The second wall layer 64*w*1 constitutes the top portion 152 of the damming wall WL. The bank portion 150 is lower than the top portion 152 of the damming wall WL, and forms a trap portion 154 having a recessed shape between the bank portion 150 and the top portion 152. The bank portion 150 of the present example surrounds a part of the damming wall WL where the second lead-out wiring line L2 extends, and forms the trap portion 154 in a locally recessed shape. The trap portion 154 functions as a receiver of a resist 202 when patterning to create the second lead-out wiring line L2 in manufacturing of the organic EL display device 1.

A depth d of the trap portion 154 is, for example, about 1.2 μm to 1.8 μm. The depth d of the trap portion 154 mentioned here means a distance from a top face of the bank portion 150 to a bottom face of the trap portion 154. The depth d of the trap portion 154 is equal to the height of the bank portion 150. A height h from the bottom face of the trap portion 154 to the top face of the damming wall WL is, for example, about 2.5 μm to 3.5 μm. The height h from the bottom face of the trap portion 154 to the top face of the damming wall WL is equal to the height of the second wall layer 64*w*1.

Operation of Organic EL Display Device

In the organic EL display device 1, in each of the subpixels Sp, first, the corresponding emission control wiring line 28*e*1 is selected and brought into an inactive state, and the organic EL element 70 is brought into a non-light-emitting state. Then, when the gate wiring line 28*g*1 corresponding to the organic EL element 70 in the non-light-emitting state is selected and brought into an active state, a gate signal is input to the first TFT 50A via the gate wiring line 28*g*1, and the first TFT 50A is brought into an on state.

When the first TFT 50A is brought into the on state, a predetermined voltage corresponding to the source signal transmitted via the source wiring line 36*s*1 is applied to the second TFT 50B and written to the capacitor 55. Then, when the emission control wiring line 28*e*1 is deselected and brought into the inactive state, an emission signal is input to the third TFT 50C via the emission control wiring line 28*e*1, and the third TFT 50C is brought into the on state.

When the third TFT 50C is brought into the on state, a current corresponding to the gate voltage of the second TFT 50B is supplied from the power source wiring line P1 to the organic EL element 70. Due to this, each organic EL layer 66 (light-emitting layer 661*e*) emits light, and an image is displayed. Note that since the gate voltage of the second TFT 50B is held by the capacitor 55 even when the first TFT 50A is brought into an off state, the light emission of the organic EL layer 66 is maintained for each of the subpixels Sp until the gate signal of the next frame is input.

Manufacturing Method of Organic EL Display Device

To manufacture the organic EL display device 1, first, the substrate layer 10 is formed by applying a resin material to the front face of a glass substrate and performing baking treatment or the like. Next, the TFT layer 20, the light-emitting element layer 60, the sealing film 80, and the touch panel TP are sequentially formed on the substrate layer 10 using a known technology such as photolithography, a vacuum vapor deposition method, or an ink-jet method. Then, the glass substrate is peeled off from the substrate layer 10 by irradiating the rear face of the substrate layer 10 with a laser beam from the glass substrate side.

Subsequently, a rear face protection film is bonded to the rear face of the substrate layer 10. Further, a front face protection film is bonded to the front face of the substrate on which the sealing film 80 is provided. Next, the display control circuit and the touch detection circuit are mounted together with the wiring board Cb by connecting the wiring board Cb to each of the first terminal portion T1 and the second terminal portion T2 of the substrate. Thus, the organic EL display device 1 is manufactured.

In the process of forming the TFT layer 20, when the second resin layer 42 is formed, a photosensitive resin material is applied, by a known application method such as spin coating, onto the substrate on which the fourth conductive layer 40 is formed. Next, a film on which the photosensitive resin material is applied is subjected to pre-baking, exposure, development, and post-baking to perform patterning on the film on which the photosensitive resin material is applied, thereby forming the second flattening film 42*pf* and the first wall layer 42*w*1.

At this time, the bank portion 150 may be formed on the first wall layer 42*w*1 with a height difference in the front face height of the first wall layer 42*w*1 by using a gray tone mask or a halftone mask for exposure of the film on which the photosensitive resin material is applied. Thereafter, in the process of forming the light-emitting element layer 60, the second wall layer 42*w*1 is formed on the first wall layer 64*w*1 as the third resin layer 64, thereby constituting the damming wall WL, and forming the trap portion 154 between the bank portion 150 of the first wall layer 42*w*1 and the second wall layer 64*w*1.

When the trap portion 154 is provided on the damming wall WL in this manner, disconnection of the second lead-out wiring line L2 (the upper layer lead-out wiring line 90*h*1 and the lower layer lead-out wiring line 110*h*1) on the damming wall WL is suppressed when the seventh conductive layer 90 and the eighth conductive layer 110 are formed. This will be described below with the process of forming the seventh conductive layer 90 as an example.

Figure 13:
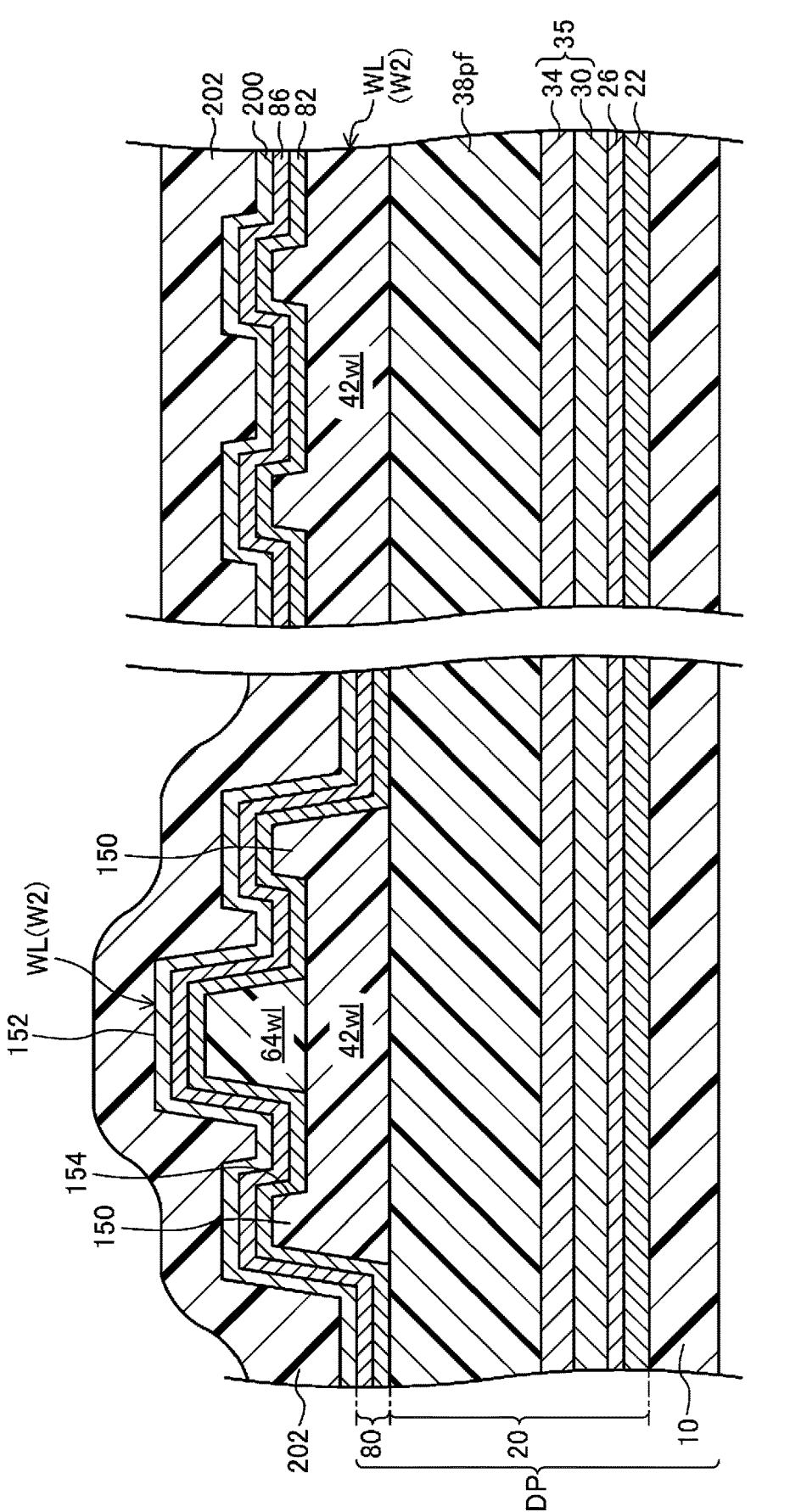
FIG. 13 is a cross-sectional view illustrating a state where a resist is applied when patterning to create a second lead-out wiring line in a manufacturing process of the organic EL display device.
Figure 14:
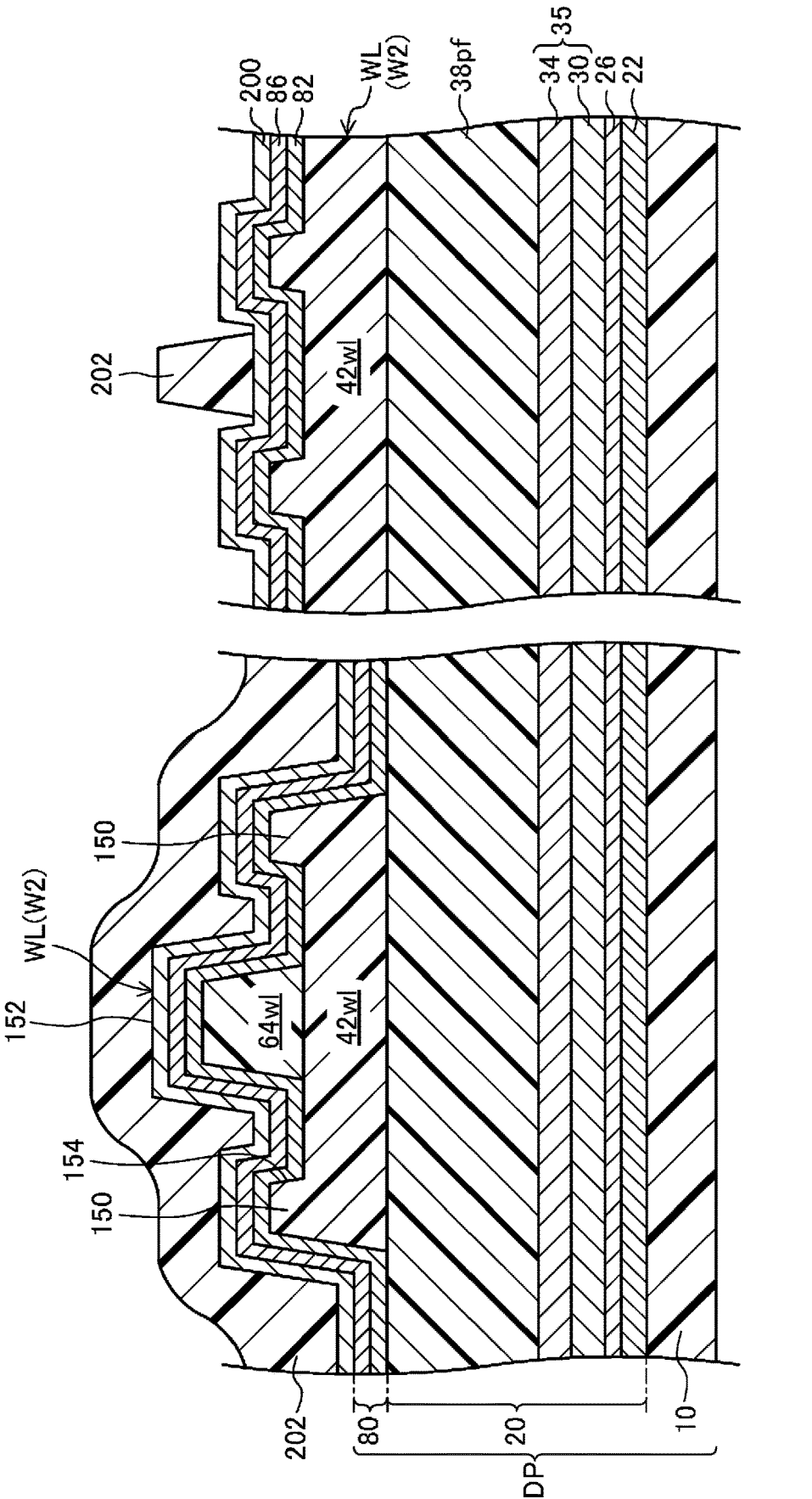
FIG. 14 is a cross-sectional view illustrating a state where a resist is developed when patterning to create the second lead-out wiring line in the manufacturing process of the organic EL display device.
Figure 15:
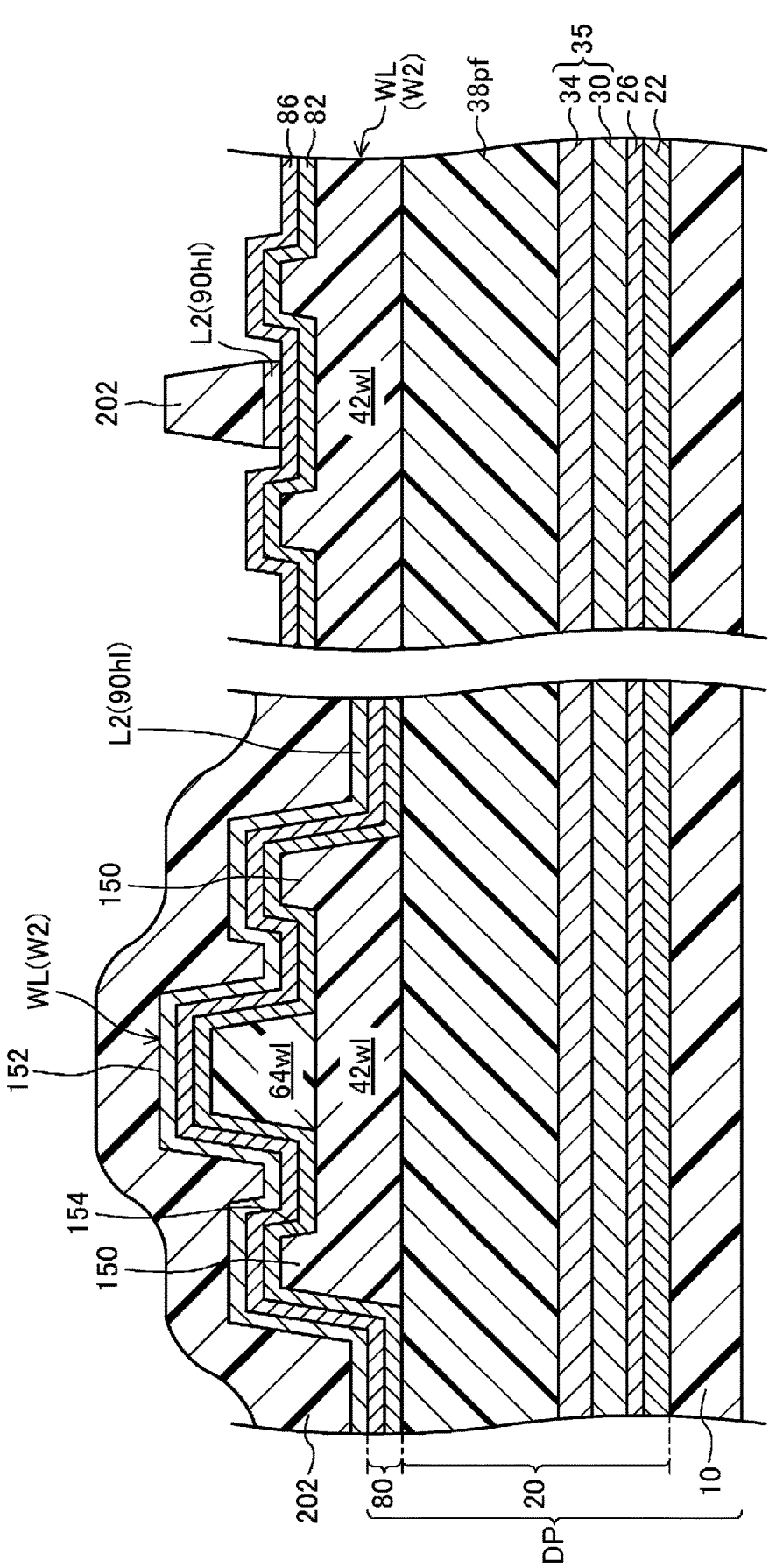
FIG. 15 is a cross-sectional view illustrating a state where patterning is performed to create the second lead-out wiring line in the manufacturing process of the organic EL display device.

In the process of forming the seventh conductive layer 90, first, a transparent conductive film 200 including indium tin oxide (ITO) is formed by, for example, a sputtering method on the substrate on which the sealing film 80 is formed. Next, as illustrated in FIG. 13, the resist 202 is applied by, for example, a spin coating method or a slit coating method on the substrate on which the transparent conductive film 200 is formed. Subsequently, the film on which the resist 202 is applied is subjected to pre-baking, exposure, development, and post-baking, thereby performing patterning on the resist 202 as illustrated in FIG. 14. Thereafter, as illustrated in FIG. 15, patterning is performed by etching the transparent conductive film 200 with the resist 202 as a mask, thereby forming the first detection electrode 90*de*, the first coupling wiring line 90*c*1, and the lower layer lead-out wiring line 90*h*1 (the second lead-out wiring line L2).

Figure 19:
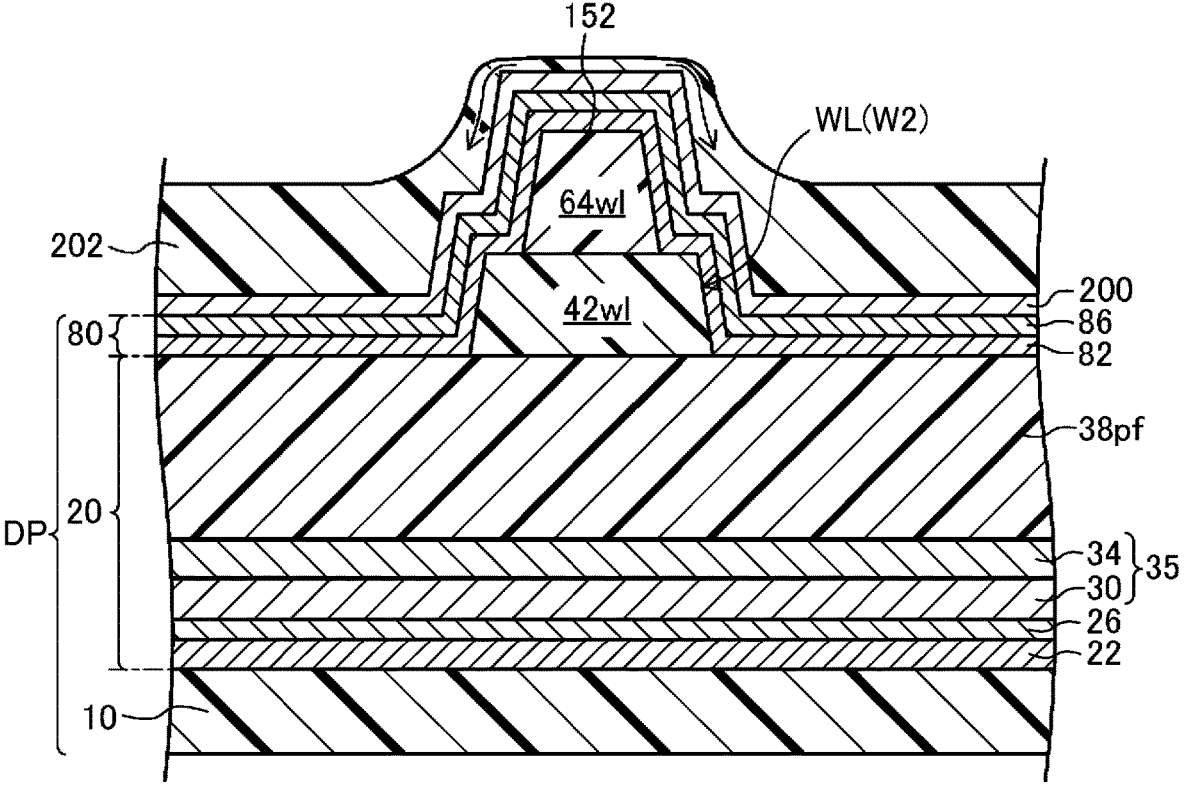
FIG. 19 is a cross-sectional view of a part corresponding to FIG. 11, illustrating a state where a resist is applied when patterning is performed to create the second lead-out wiring line in the manufacturing process of an organic EL display device of a comparative example.
Figure 20:
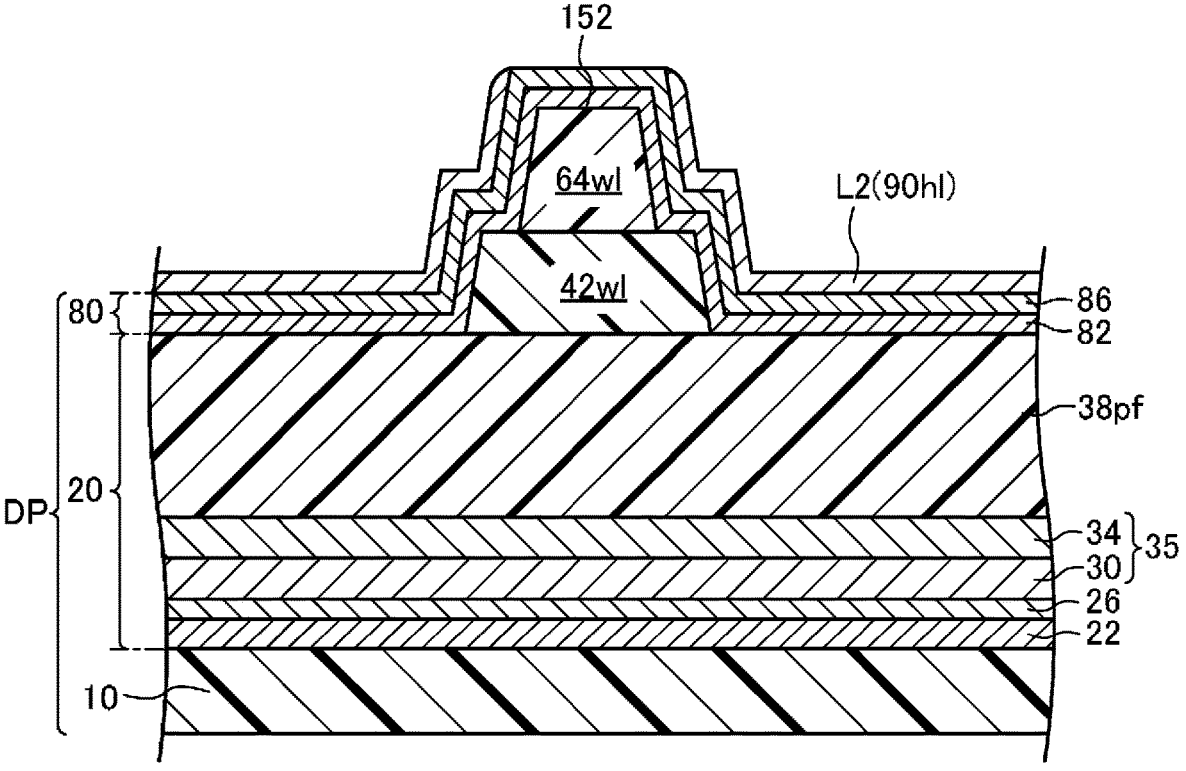
FIG. 20 is a cross-sectional view illustrating a state where patterning is performed to create the second lead-out wiring line in the manufacturing process of the organic EL display device of the comparative example.

At this time, as illustrated in FIG. 19, if the trap portion 154 is not formed on the damming wall WL, the resist 202 flows from the top portion 152 of the damming wall WL to both sides, and a state where the top portion of the damming wall WL cannot be suitably covered is likely to occur. In this case, at the time of patterning to create the second lead-out wiring line L2, the transparent conductive film 200 is etched also at the part where the second lead-out wiring line L2 on the damming wall WL is formed. As a result, as illustrated in FIG. 20, the second lead-out wiring line L2 is lost, and disconnection occurs in the second lead-out wiring line L2.

On the other hand, since the damming wall WL of the present example is provided with the trap portion 154, when the resist 202 is applied on the substrate on which the transparent conductive film 200 is formed, the resist 202 is accumulated in the trap portion 154 of the damming wall WL (see FIG. 13). This makes it possible to reduce the resist 202 from flowing from the top portion 152 of the damming wall WL to both sides. Due to this, the resist 202 is provided in a state of suitably covering the top portion 152 of the damming wall WL, and it is possible to suppress the transparent conductive film 200 from being etched even at the part where the second lead-out wiring line L2 on the damming wall WL is formed. Therefore, disconnection of the second lead-out wiring line L2 on the damming wall WL can be suppressed.

First Modified Example

Figure 16:
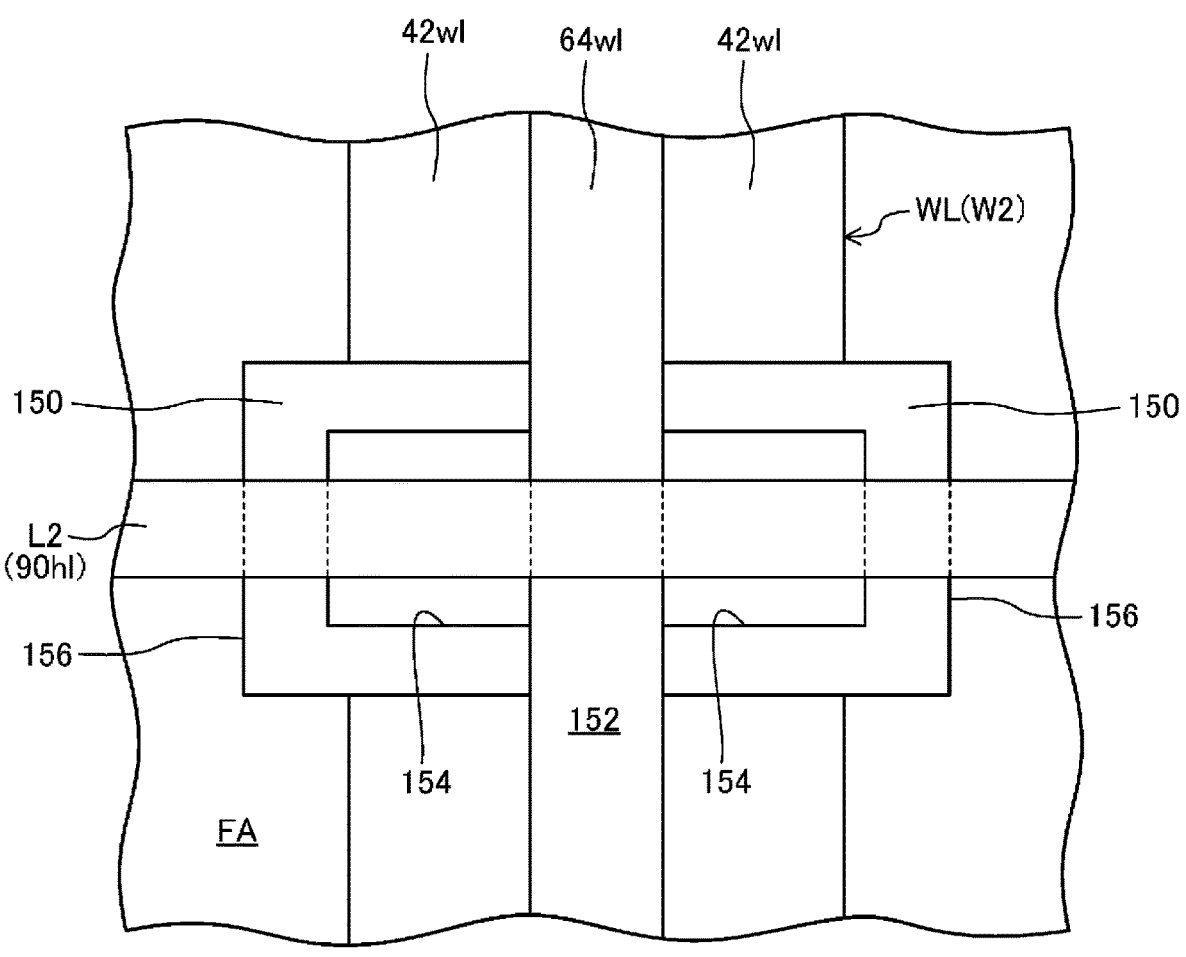
FIG. 16 is a plan view illustrating a schematic configuration of a part corresponding to FIG. 10 in an organic EL display device of a first modified example.

As illustrated in FIG. 16, in the organic EL display device 1 of the first modified example, the damming wall WL has an overhanging portion 156 that overhangs on both sides in the direction in which the second lead-out wiring line L2 extends, that is, both sides in the width direction of the damming wall WL. The overhanging portion 156 is provided on the first wall layer 42*w*1 at a part where the second lead-out wiring line L2 of the damming wall WL intersects. That is, the overhanging portion 156 is constituted by the first wall layer 42*w*1.

The bank portion 150 is provided in the overhanging portion 156 and extends along the outer edge of the overhanging portion 156. When the bank portion 150 is provided in the overhanging portion 156 in this manner, the size of the trap portion 154 provided on the damming wall WL increases by the overhanging amount of the overhanging portion 156. This is advantageous for reducing the resist 202 from flowing from the top portion 152 of the damming wall WL to both sides at the time of patterning to create the second lead-out wiring line L2. Therefore, disconnection of the second lead-out wiring line L2 on the damming wall WL can be suitably suppressed.

Second Modified Example

Figure 17:
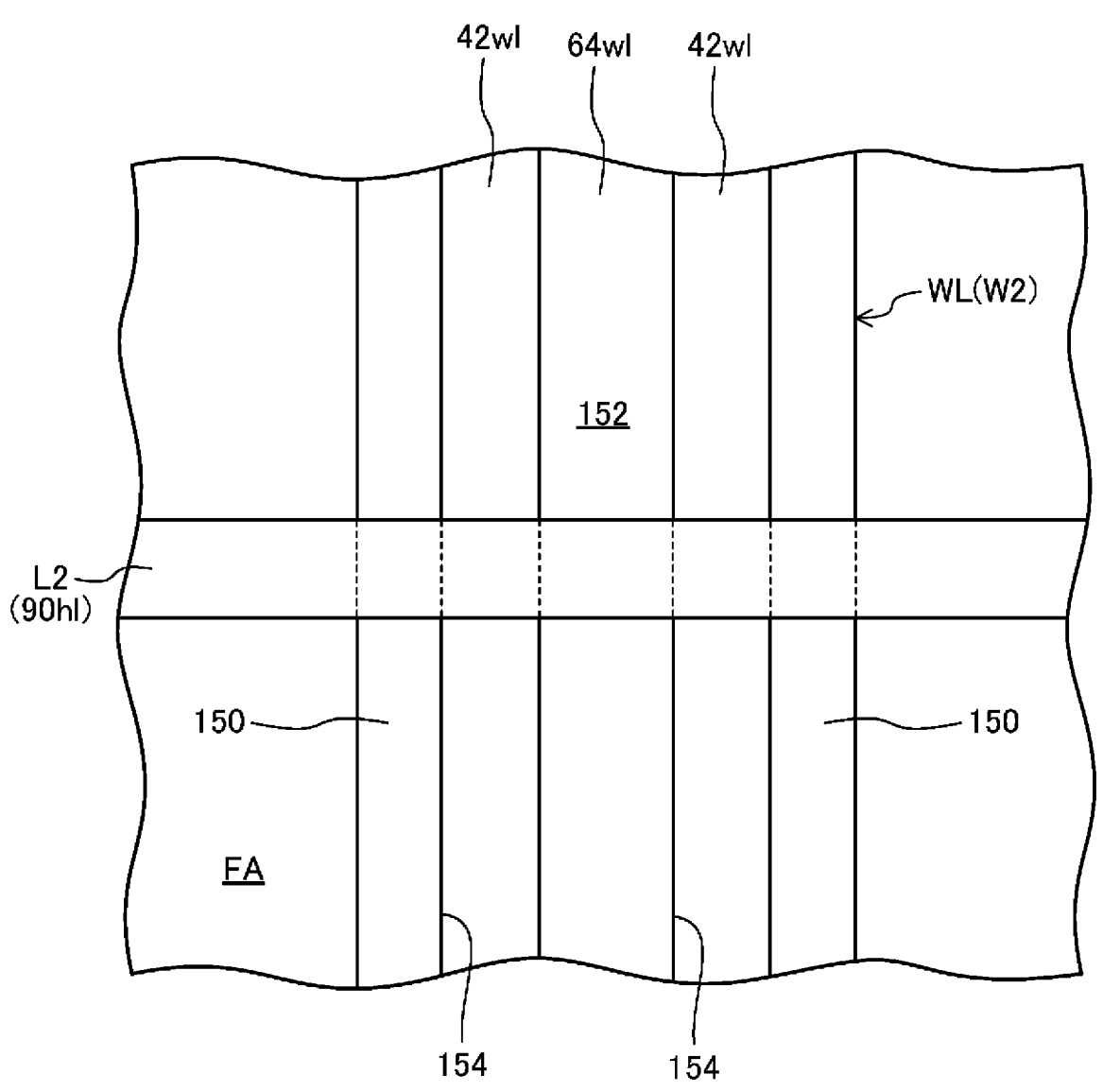
FIG. 17 is a cross-sectional view illustrating a part corresponding to FIG. 11 in an organic EL display device of a second modified example.

As illustrated in FIG. 17, in the organic EL display device 1 of the second modified example, the damming wall WL is doubly provided with the bank portion 150 extending along the top portion 152 over the entire circumference. The one bank portion 150 is formed on an inner peripheral side (the display region DA side) of the top portion 152 of the damming wall WL at an interval from the top portion 152. The other bank portion 150 is formed on an outer peripheral side (outside the frame region FA) of the top portion 152 of the damming wall WL at an interval from the top portion 152.

The bank portion 150 of the present example is constituted by both end parts of the first wall layer 42*w*1 in the width direction. Each bank portion 150 forms the trap portion 154 in a groove shape between the bank portion 150 and the top portion 152 of the damming wall WL. Even when the trap portion 154 is formed in a groove shape in this manner, since the resist 202 can be accumulated in the trap portion 154 at the time of patterning to create the second lead-out wiring line L2, the resist 202 can be reduced from flowing from the top portion 152 of the damming wall WL to both sides. Due to this, effects similar to those of the above embodiment can be obtained.

Third Modified Example

Figure 18:
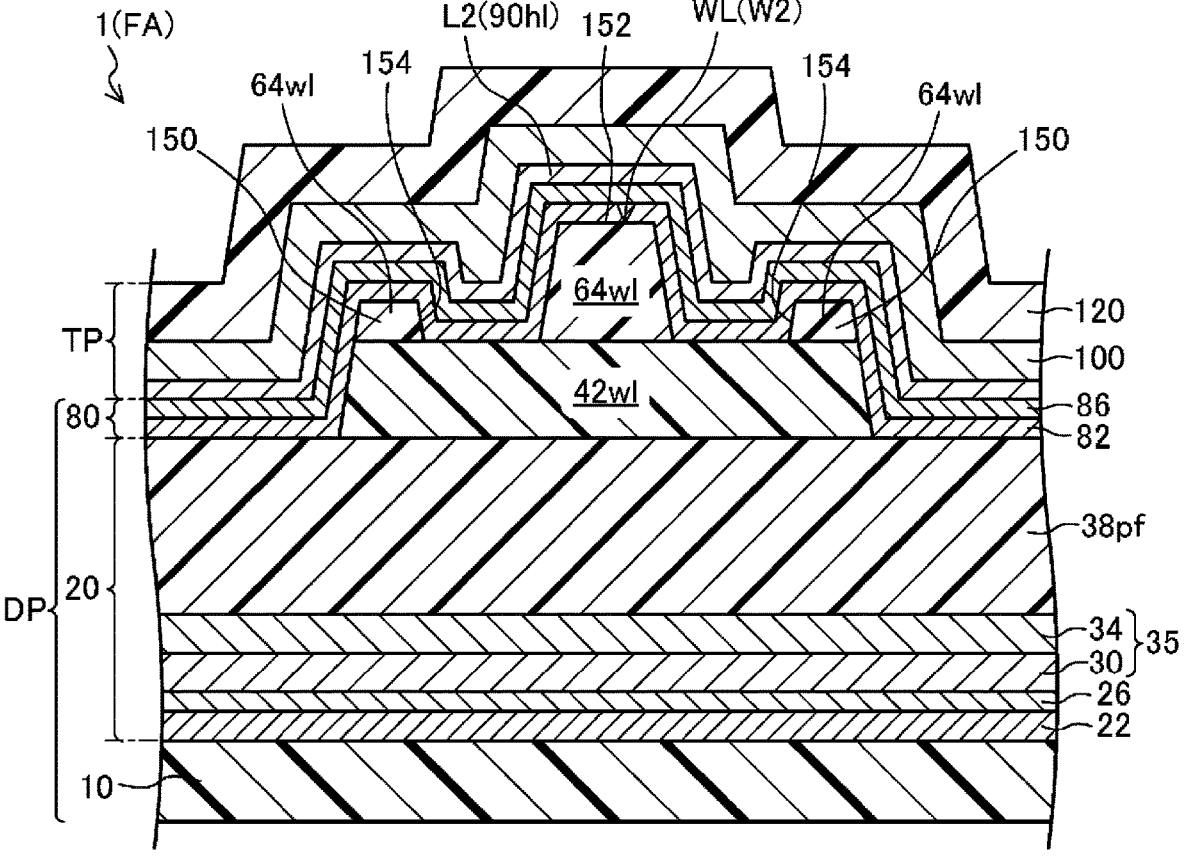
FIG. 18 is a plan view illustrating a schematic configuration of a part corresponding to FIG. 10 in an organic EL display device of a third modified example.

As illustrated in FIG. 18, in the organic EL display device 1 of the third modified example, the bank portion 150 of the damming wall WL is constituted by the second wall layer 64w1. The second wall layer 64w1 constituting the bank portion 150 is formed separately from the second wall layer 64w1 constituting the top portion 152 of the damming wall WL. The second wall layer 64w1 constituting the bank portion 150 and the second wall layer 64w1 constituting the top portion 152 of the damming wall WL may be continuous. In this case, the trap portion 154 is formed only of the second wall layer 64w1.

Other Embodiments

In the above embodiment, the bank portion 150 provided on the damming wall WL is provided separately on both sides in the width direction of the second wall layer 64w1, but no limitation is intended. The bank portion 150 may be continuous on a lower side of the second wall layer 64w1 and provided in a frame-like shape. The bank portion 150 and the trap portion 154 may be provided only on one side in the direction (the width direction of the damming wall WL) where the second lead-out wiring line L2 extends with respect to the top portion 152 of the damming wall WL.

In the above embodiment, the damming wall WL (the first damming wall W1 and the second damming wall W2) is configured by the first wall layer 42w1 formed of the same material on the same layer as the second flattening film 42pf and the second wall layer 64w1 formed of the same material on the same layer as the edge cover 64ec, but no limitation is intended. The damming wall WL may be configured by a first wall layer formed of the same material on the same layer as the first flattening film 38pf and a second wall layer formed of the same material on the same layer as the second flattening film 42pf. Furthermore, the damming wall WL may have a three-layer structure having a third wall layer formed of the same material on the same layer as the edge cover 64ec.

In the above embodiment, the organic EL display device 1 provided with the damming wall WL (the first damming wall W1 and the second damming wall W2) as the wall body has been described as an example, but no limitation is intended. The wall body may be provided for a purpose other than damming the organic material forming the organic sealing layer 84, such as suppressing development of a crack in an inorganic layer including an inorganic insulating material.

In the above embodiment, the organic EL layer 66 is provided in the individual subpixels Sp, but no limitation is intended. The organic EL layer 66 may be continuously provided in common in the plurality of subpixels Sp. In this case, the organic EL display device 1 may include a color filter, for example, to perform color tone expression of each of the subpixels Sp.

In the above embodiment, each of the pixels Px is constituted by the subpixels Spr, Spg, and Spb of three colors, but no limitation is intended. The subpixels Sp constituting each of the pixels Px are not limited to having the three colors, and may have four or more colors. The subpixels Spr, Spg, and Spb of three colors constituting each of the pixels Px are provided in a stripe array, but no limitation is intended. The array of the plurality of subpixels Sp may be another array such as a PenTile array.

In the above embodiment, the first TFT 50A, the second TFT 50B, and the third TFT 50C are each configured as the top gate type, but no limitation is intended. The first TFT 50A, the second TFT 50B, and the third TFT 50C may be configured as a bottom gate type. The number of TFTs 50 provided in the subpixel Sp may be two, or may be four or more.

In the above embodiment, the pixel electrode 62pe is an anode electrode, and the common electrode 68ce is a cathode electrode, but no limitation is intended. The pixel electrode 62pe may be a cathode electrode, and the common electrode 68ce may be an anode electrode. In this case, the organic EL layer 66 has an inverted layered structure.

In the above embodiment, the organic EL layer 66 has a five-layer structure including the hole injection layer 66hi, the hole transport layer 66ht, the light-emitting layer 66le, the electron transport layer 66et, and the electron injection layer 66ei, but no limitation is intended. The organic EL layer 66 may have a three-layer structure including a hole injection layer and hole transport layer, a light-emitting layer, and an electron transport layer and electron injection layer, and an arbitrary layered structure can be adopted.

In the above embodiment, the organic EL display device 1 has been exemplified as a display device, but no limitation is intended. The technology of the disclosure can be applied to a display device including a plurality of light-emitting elements driven by a current, for example. Examples of the display device include a display device including a Quantum-dot light emitting diode (QLED), which is a light-emitting element using a quantum dot-containing layer.

As described above, the preferred embodiments are described as examples of the technique of the disclosure. However, the technique of the disclosure is not limited to the embodiments and the modified examples, and is also applicable to an embodiment in which modification, replacement, adding, omission, and the like are suitably made. It is understood by those skilled in the art that various modified examples can be made to the above embodiment without departing from the spirit of the technology of the disclosure, and such modified examples also belong to the scope of the technology of the disclosure.

The invention claimed is:

1. A display device comprising:
   a substrate layer;
   a light-emitting element layer including a plurality of light-emitting elements and supported by the substrate layer;
   a display region configured to display an image by light emission of the plurality of light-emitting elements, and
   a frame region provided outside the display region,
   wherein:
      the frame region is provided with a wall body, that is supported by the substrate layer and that extends on an outer periphery of the display region, and a wiring line extending across the wall body from a display region side to an outside of the frame region,
      the wall body includes a bank portion having a projecting shape and provided, in a part of the wall body where the wiring line extends, on at least one side of the wiring line in a direction in which the wiring line extends with respect to a top portion of the wall body, the wall body includes an overhanging portion that overhangs in the direction in which the wiring line extends with respect to the top portion of the wall body, and the bank portion is provided in the overhanging portion, the bank portion is lower than the top portion of the wall body and forms, between the bank portion and the top portion, a trap portion having a recessed shape, and the bank portion surrounds the part of the wall body where the wiring line extends, and forms the trap portion in a recessed shape between the bank portion and the top portion.

2. The display device according to claim 1, wherein the bank portion is provided on both sides of the wiring line in the direction in which the wiring line extends with respect to the top portion of the wall body.

3. The display device according to claim 1, wherein:

the wall body includes a first wall layer supported by the substrate layer, and a second wall layer provided on the first wall layer, the second wall layer forms the top portion of the wall body, and the first wall layer constitutes-forms the bank portion.

4. The display device according to claim 1, wherein:

the wall body includes a first wall layer supported by the substrate layer, and a second wall layer provided on the first wall layer, and the second wall layer forms the top portion of the wall body and the bank portion.

5. The display device according to claim 3, further comprising:

a thin film transistor layer, including a plurality of thin film transistors, and provided between the substrate layer and the light-emitting element layer, wherein:

the thin film transistor layer includes a flattening film covering the plurality of thin film transistors, the light-emitting element layer includes a plurality of electrodes and an edge cover sectioning the plurality of electrodes, the first wall layer is formed of a same material, and on a same layer, as the flattening film, and the second wall layer is formed of a same material, and on a same layer, as the edge cover.

6. The display device according to claim 1, further comprising:

a sealing film covering the plurality of light-emitting elements, wherein;

the sealing film includes a first inorganic sealing layer, an organic sealing layer provided on the first inorganic sealing layer, and a second inorganic sealing layer provided on the organic sealing layer, the wall body is provided in a frame-like shape surrounding the display region, and the organic sealing layer is provided inside the wall body.

7. The display device according to claim 1, wherein each light-emitting element of the plurality of light-emitting elements is an organic electroluminescence element.

8. A display device comprising:

a substrate layer;

a light-emitting element layer including a plurality of light-emitting elements and supported by the substrate layer;

a display region configured to display an image by light emission of the plurality of light-emitting elements, and a frame region provided outside the display region, wherein:

the frame region is provided with a wall body, that is supported by the substrate layer and that extends on an outer periphery of the display region, and a wiring line extending across the wall body from a display region side to an outside of the frame region, the wall body includes a bank portion having a projecting shape and provided, in a part of the wall body where the wiring line extends, on at least one side of the wiring line in a direction in which the wiring line extends with respect to a top portion of the wall body, the wall body includes a first wall layer supported by the substrate layer and a second wall layer provided on the first wall layer, the second wall layer forms the top portion of the wall body, and the first wall layer forms the bank portion, the bank portion is lower than the top portion of the wall body and forms, between the bank portion and the top portion, a trap portion having a recessed shape, and the bank portion surrounds the part of the wall body where the wiring line extends, and forms the trap portion in a recessed shape between the bank portion and the top portion.

9. The display device according to claim 8, wherein the bank portion is provided on both sides of the wiring line in the direction in which the wiring line extends with respect to the top portion of the wall body.

10. The display device according to claim 8, further comprising:

a thin film transistor layer, including a plurality of thin film transistors, and provided between the substrate layer and the light-emitting element layer, wherein:

the thin film transistor layer includes a flattening film covering the plurality of thin film transistors, the light-emitting element layer includes a plurality of electrodes, and an edge cover sectioning the plurality of electrodes, the first wall layer is formed of a same material, and on a same layer, as the flattening film, and the second wall layer is formed of a same material, and on a same layer, as the edge cover.

11. The display device according to claim 8, further comprising:

a sealing film covering the plurality of light-emitting elements, wherein:

the sealing film includes a first inorganic sealing layer, an organic sealing layer provided on the first inorganic sealing layer, and a second inorganic sealing layer provided on the organic sealing layer, the wall body is provided in a frame-like shape surrounding the display region, and the organic sealing layer is provided inside the wall body.

12. The display device according to claim 8, wherein each light-emitting element of the plurality of light-emitting elements is an organic electroluminescence element.

13. A display device comprising:

a substrate layer;

a light-emitting element layer including a plurality of light-emitting elements and supported by the substrate layer;

a display region configured to display an image by light emission of the plurality of light-emitting elements, and a frame region provided outside the display region, wherein:

the frame region is provided with a wall body, that is supported by the substrate layer and that extends on an outer periphery of the display region, and a wiring line extending across the wall body from a display region side to an outside of the frame region, the wall body includes a bank portion having a projecting shape and provided, in a part of the wall body where the wiring line extends, on at least one side of the wiring line in a direction in which the wiring line extends with respect to a top portion of the wall body, the wall body includes a first wall layer supported by the substrate layer, and a second wall layer provided on the first wall layer, and the second wall layer forms the top portion of the wall body and the bank portion, the bank portion is lower than the top portion of the wall body and forms, between the bank portion and the top portion, a trap portion having a recessed shape, and the bank portion surrounds the part of the wall body where the wiring line extends, and forms the trap portion in a recessed shape between the bank portion and the top portion.

14. The display device according to claim 13, wherein the bank portion is provided on both sides of the wiring line in the direction in which the wiring line extends with respect to the top portion of the wall body.

15. The display device according to claim 13, further comprising:

a thin film transistor layer, including a plurality of thin film transistors, and provided between the substrate layer and the light-emitting element layer, wherein:

the thin film transistor layer includes a flattening film covering the plurality of thin film transistors, the light-emitting element layer includes a plurality of electrodes, and an edge cover sectioning the plurality of electrodes, the first wall layer is formed of a same material, and on a same layer, as the flattening film, and the second wall layer is formed of a same material, and on a same layer, as the edge cover.

16. The display device according to claim 13, further comprising:

a sealing film covering the plurality of light-emitting elements, wherein:

the sealing film includes a first inorganic sealing layer, an organic sealing layer provided on the first inorganic sealing layer, and a second inorganic sealing layer provided on the organic sealing layer, the wall body is provided in a frame-like shape surrounding the display region, and the organic sealing layer is provided inside the wall body.

17. The display device according to claim 13, wherein each light-emitting element of the plurality of light-emitting elements is an organic electroluminescence element.

\* \* \* \* \*